(12) United States Patent
van de Ven et al.

(10) Patent No.: US 9,425,172 B2
(45) Date of Patent: Aug. 23, 2016

(54) LIGHT EMITTER ARRAY

(75) Inventors: Antony P. van de Ven, Hong Kong (CN); Gerald Negley, Durham, NC (US)

(73) Assignee: CREE, INC., Durham, NC (US)

( * ) Notice: Subject to any disclaimer, the term of this patent is extended or adjusted under 35 U.S.C. 154(b) by 0 days.

(21) Appl. No.: 12/288,957

(22) Filed: Oct. 24, 2008

(65) Prior Publication Data

US 2010/0103660 A1 Apr. 29, 2010

(51) Int. Cl.
*H01L 25/075* (2006.01)
*H01L 25/16* (2006.01)
*H01L 33/58* (2010.01)

(52) U.S. Cl.
CPC .......... *H01L 25/0753* (2013.01); *H01L 25/167* (2013.01); *H01L 33/58* (2013.01); *H01L 2224/32245* (2013.01);
(Continued)

(58) Field of Classification Search
CPC .......... F21Y 2101/02; F21Y 2105/001; F21Y 2105/003; G09G 3/3413; G09G 3/32; G09G 3/3406; G02F 1/133603; G02F 1/133611; G02F 2201/52; G02F 2001/133613; H01L 33/486; H01L 27/3211; H01L 33/62; H01L 2224/48137; H01L 2224/48227; H01L 25/071; H05B 33/0857; H05B 33/0803; H05B 33/086; H05B 33/0842; Y10S 362/80; F21K 9/00; F21S 4/00; F21V 5/00
USPC .............. 362/231, 235, 240, 244, 249.01, 362/249.02, 249.06, 276, 310, 544, 545, 362/800, 812; 257/98–100, 130, 678, 257/E33.073; 349/61, 62, 68, 69; 313/499, 313/500, 512
See application file for complete search history.

(56) References Cited

U.S. PATENT DOCUMENTS 3,674,990 A 7/1972 Kurauchi et al. ........ 235/462.16
3,760,237 A 9/1973 Jaffe ............................. 257/98
(Continued)

FOREIGN PATENT DOCUMENTS

CN 1406450 A 3/2003
CN 1460393 12/2003
(Continued)

OTHER PUBLICATIONS

Titan Turbo LED Light Engines by Lamina, data sheet 2008, pp. 1-14.
(Continued)

*Primary Examiner* — Hargobind S Sawhney
(74) *Attorney, Agent, or Firm* — Koppel, Patrick, Hebyl & Philpott

(57) ABSTRACT

Lamps, luminaries or solid state lighting components are disclosed having multiple discrete light sources whose light combines to provide the desired emission characteristics. The discrete light sources are arranged in an array pursuant to certain guidelines to promote mixing of light from light sources emitting different colors of light. One embodiment solid state lighting component comprises a light emitting diode (LED) component having an array of LED chips having a first group of LED chips and one or more additional groups of LED chips. The array is arranged so that no two LED chips from said first group are directly next to one another in the array, that less than fifty percent (50%) of the LED chips in the first group of LEDs is on the perimeter of the array, and at least three LED chips from the one or more additional groups is adjacent each of the LED chips in the first group.

47 Claims, 5 Drawing Sheets

(52) U.S. Cl.
CPC ............... *H01L 2224/48091* (2013.01); *H01L 2224/48247* (2013.01); *H01L 2224/73265* (2013.01); *H01L 2924/3025* (2013.01)

(56) References Cited

U.S. PATENT DOCUMENTS

| | | | |
|---|---|---|---|
| 3,900,863 A | 8/1975 | Kim | 257/95 |
| 4,322,735 A | 3/1982 | Sadamasa et al. | 257/89 |
| 4,500,914 A * | 2/1985 | Watanabe et al. | 348/280 |
| 4,511,425 A | 4/1985 | Boyd | 156/493 |
| 4,946,547 A | 8/1990 | Palmour et al. | 156/643 |
| 4,992,704 A | 2/1991 | Stinson | 315/312 |
| 5,130,761 A | 7/1992 | Tanaka | 357/17 |
| 5,184,114 A * | 2/1993 | Brown | 345/83 |
| 5,200,022 A | 4/1993 | Kong et al. | 156/612 |
| 5,278,432 A | 1/1994 | Ignatius et al. | 257/88 |
| RE34,861 E | 2/1995 | Davis et al. | 437/100 |
| 5,453,405 A | 9/1995 | Fan et al. | 438/34 |
| 5,578,998 A | 11/1996 | Kasprowicz | 340/642 |
| 5,643,834 A | 7/1997 | Harada et al. | 438/122 |
| 5,706,177 A | 1/1998 | Nather | |
| 5,790,298 A | 8/1998 | Tonar | 359/267 |
| 5,813,753 A | 9/1998 | Vriens et al. | 362/293 |
| 5,907,151 A | 5/1999 | Gramann | |
| 5,924,785 A | 7/1999 | Zhang et al. | 362/241 |
| 5,946,022 A | 8/1999 | Kamimura | 347/238 |
| 5,959,316 A | 9/1999 | Lowery | 257/98 |
| 5,990,497 A | 11/1999 | Kamakura et al. | |
| 6,061,160 A | 5/2000 | Maruyama | 359/152 |
| 6,066,861 A | 5/2000 | Hohn et al. | |
| 6,093,940 A | 7/2000 | Ishinaga et al. | 257/99 |
| 6,149,283 A | 11/2000 | Conway et al. | 362/236 |
| 6,183,100 B1 | 2/2001 | Suckow et al. | 362/35 |
| 6,224,216 B1 | 5/2001 | Parker et al. | |
| 6,259,608 B1 | 7/2001 | Berardinelli et al. | |
| 6,296,367 B1 | 10/2001 | Parsons et al. | 362/183 |
| 6,297,598 B1 | 10/2001 | Wang et al. | 315/169.3 |
| 6,359,236 B1 | 3/2002 | Distefano et al. | |
| 6,376,902 B1 | 4/2002 | Arndt | 257/678 |
| 6,454,437 B1 | 9/2002 | Kelly | 362/246 |
| 6,469,321 B2 | 10/2002 | Arndt | |
| 6,476,410 B2 | 11/2002 | Ishinaga | 257/13 |
| 6,501,084 B1 | 12/2002 | Sakai et al. | 250/504 R |
| 6,573,537 B1 | 6/2003 | Steigerwald et al. | 257/103 |
| 6,573,580 B2 | 6/2003 | Arndt | |
| 6,577,073 B2 | 6/2003 | Shimizu et al. | |
| 6,614,058 B2 | 9/2003 | Lin et al. | |
| 6,617,795 B2 | 9/2003 | Bruning | 315/151 |
| 6,624,491 B2 | 9/2003 | Waitl et al. | |
| 6,637,921 B2 | 10/2003 | Coushaine | 362/517 |
| 6,661,029 B1 | 12/2003 | Duggal | 257/89 |
| 6,672,741 B1 | 1/2004 | Young | 362/311 |
| 6,680,490 B2 | 1/2004 | Yasukawa et al. | |
| 6,686,609 B1 | 2/2004 | Sung | |
| 6,707,069 B2 | 3/2004 | Song et al. | 257/79 |
| 6,710,373 B2 | 3/2004 | Wang | |
| 6,722,777 B2 | 4/2004 | Erber | 362/518 |
| 6,739,735 B2 | 5/2004 | Talamo et al. | 362/237 |
| 6,759,733 B2 | 7/2004 | Arndt | |
| 6,767,112 B2 | 7/2004 | Wu | 362/247 |
| 6,770,498 B2 | 8/2004 | Hsu | 438/26 |
| 6,774,401 B2 | 8/2004 | Nakada et al. | |
| 6,811,277 B2 | 11/2004 | Amano | 362/31 |
| 6,846,101 B2 | 1/2005 | Coushaine | 362/517 |
| 6,858,879 B2 | 2/2005 | Waitl | |
| 6,872,585 B2 | 3/2005 | Matsumura et al. | |
| 6,876,149 B2 | 4/2005 | Miyashita | |
| 6,893,140 B2 | 5/2005 | Storey et al. | 362/191 |
| 6,899,443 B2 | 5/2005 | Rizkin et al. | 362/327 |
| 6,900,511 B2 | 5/2005 | Ruhnau et al. | |
| 6,909,123 B2 * | 6/2005 | Hayashimoto et al. | 257/98 |
| 6,911,678 B2 | 6/2005 | Fujisawa et al. | |
| 6,919,586 B2 | 7/2005 | Fujii | |
| 6,948,825 B2 | 9/2005 | Christoph | 362/33 |
| 6,995,510 B2 | 2/2006 | Murakami et al. | |
| 7,001,047 B2 | 2/2006 | Holder et al. | 362/296 |
| 7,002,546 B1 * | 2/2006 | Stuppi et al. | 345/102 |
| 7,015,512 B2 | 3/2006 | Park et al. | 257/99 |
| 7,021,797 B2 | 4/2006 | Minano et al. | 362/355 |
| 7,029,150 B2 | 4/2006 | Finch | 362/298 |
| 7,095,053 B2 | 8/2006 | Mazzochette et al. | 257/81 |
| 7,097,334 B2 | 8/2006 | Ishida et al. | 362/516 |
| 7,119,422 B2 | 10/2006 | Chin | 257/666 |
| 7,121,691 B2 | 10/2006 | Coushaine et al. | 362/298 |
| 7,131,760 B2 | 11/2006 | Mayer et al. | 362/555 |
| 7,176,503 B2 | 2/2007 | Kim et al. | 257/100 |
| 7,178,937 B2 | 2/2007 | McDermott | 362/187 |
| 7,204,607 B2 | 4/2007 | Yano et al. | 362/231 |
| 7,213,940 B1 | 5/2007 | Van de Ven et al. | |
| 7,224,000 B2 | 5/2007 | Aanegola et al. | 257/98 |
| 7,230,280 B2 | 6/2007 | Yaw et al. | 257/98 |
| 7,246,921 B2 | 7/2007 | Jacobson et al. | 362/294 |
| 7,252,408 B2 | 8/2007 | Mazzochette et al. | 362/294 |
| 7,259,400 B1 * | 8/2007 | Taskar | 257/98 |
| 7,262,437 B2 | 8/2007 | Bogner et al. | 257/95 |
| 7,270,448 B1 | 9/2007 | Maley, Sr. | 362/334 |
| 7,285,802 B2 | 10/2007 | Ouderkirk et al. | 257/98 |
| 7,355,562 B2 | 4/2008 | Schubert et al. | 345/1.3 |
| 7,381,995 B2 | 6/2008 | Tain et al. | |
| 7,387,421 B2 * | 6/2008 | Lee et al. | 362/612 |
| D572,210 S | 7/2008 | Lee | D13/180 |
| D572,670 S | 7/2008 | Ono et al. | D13/180 |
| D576,574 S | 9/2008 | Kobayakawa | D13/180 |
| 7,439,549 B2 | 10/2008 | Marchl et al. | 257/88 |
| 7,478,922 B2 | 1/2009 | Garbus, Jr. | 362/231 |
| 7,528,421 B2 * | 5/2009 | Mazzochette | 257/99 |
| 7,605,452 B2 | 10/2009 | Yamanaka et al. | 257/676 |
| 7,621,655 B2 | 11/2009 | Roberts et al. | 362/249.02 |
| 7,665,861 B2 | 2/2010 | Blumel et al. | 362/249.02 |
| 7,700,964 B2 * | 4/2010 | Morimoto et al. | 257/98 |
| 7,723,744 B2 * | 5/2010 | Gillies et al. | 257/98 |
| 7,772,609 B2 | 8/2010 | Yan | |
| 7,821,023 B2 * | 10/2010 | Yuan et al. | 257/98 |
| 7,829,899 B2 | 11/2010 | Hutchins | 257/79 |
| 7,897,980 B2 | 3/2011 | Yuan et al. | 257/88 |
| 7,902,560 B2 * | 3/2011 | Bierhuizen et al. | 257/82 |
| 7,993,036 B2 | 8/2011 | Holder | 362/311.02 |
| 8,022,626 B2 * | 9/2011 | Hamby et al. | 313/512 |
| 8,035,603 B2 | 10/2011 | Furukawa et al. | 345/102 |
| 8,098,364 B2 | 1/2012 | Yu et al. | 355/55 |
| 8,183,585 B2 * | 5/2012 | Scotch et al. | 257/97 |
| 8,188,486 B2 * | 5/2012 | Lapatovich et al. | 257/79 |
| 8,272,757 B1 | 9/2012 | Fan et al. | 362/231 |
| 8,385,735 B2 * | 2/2013 | Awazu | 396/236 |
| 8,511,855 B2 | 8/2013 | Marchl et al. | |
| 2001/0032985 A1 | 10/2001 | Bhat | 257/88 |
| 2001/0033726 A1 | 10/2001 | Shie et al. | 385/133 |
| 2002/0001193 A1 | 1/2002 | Osawa | |
| 2002/0029071 A1 | 3/2002 | Whitehurst | |
| 2002/0070681 A1 | 6/2002 | Shimizu et al. | 315/246 |
| 2002/0093820 A1 | 7/2002 | Pederson | |
| 2002/0113246 A1 | 8/2002 | Nagai et al. | |
| 2002/0136025 A1 | 9/2002 | Zhang | |
| 2002/0171911 A1 | 11/2002 | Maegawa | |
| 2003/0053310 A1 | 3/2003 | Sommers et al. | |
| 2003/0058641 A1 | 3/2003 | Watanabe | |
| 2003/0063475 A1 | 4/2003 | Simmons | |
| 2003/0072153 A1 | 4/2003 | Matsui et al. | |
| 2003/0116769 A1 | 6/2003 | Song et al. | |
| 2003/0142712 A1 | 7/2003 | Ikeda et al. | 372/36 |
| 2003/0147055 A1 | 8/2003 | Yokoyama | |
| 2003/0171150 A1 | 9/2003 | Oki et al. | 463/51 |
| 2003/0183852 A1 | 10/2003 | Takenaka | |
| 2003/0189829 A1 | 10/2003 | Shimizu et al. | 362/240 |
| 2004/0026706 A1 * | 2/2004 | Bogner et al. | 257/99 |
| 2004/0037076 A1 | 2/2004 | Katoh | 362/235 |
| 2004/0041222 A1 | 3/2004 | Loh | |
| 2004/0047151 A1 | 3/2004 | Bogner et al. | |
| 2004/0079957 A1 | 4/2004 | Andrews et al. | |
| 2004/0080939 A1 | 4/2004 | Braddell et al. | |
| 2004/0099874 A1 | 5/2004 | Chang et al. | 257/98 |
| 2004/0104391 A1 | 6/2004 | Maeda et al. | 257/79 |
| 2004/0126913 A1 | 7/2004 | Loh | |
| 2004/0135522 A1 | 7/2004 | Berman et al. | |

(56) References Cited

U.S. PATENT DOCUMENTS

| | | |
|---|---|---|
| 2004/0155565 A1 | 8/2004 | Holder et al. |
| 2004/0184272 A1 | 9/2004 | Wright et al. ............... 362/373 |
| 2004/0188696 A1 | 9/2004 | Hsing Chen ................. 257/99 |
| 2004/0222433 A1 | 11/2004 | Mazzochette et al. |
| 2004/0227149 A1 | 11/2004 | Ibbetson |
| 2004/0239242 A1 | 12/2004 | Mano et al. |
| 2004/0245532 A1 | 12/2004 | Maeda et al. ................. 257/89 |
| 2004/0256626 A1 | 12/2004 | Wang |
| 2004/0264193 A1 | 12/2004 | Okumura |
| 2005/0023548 A1 | 2/2005 | Bhat |
| 2005/0024868 A1 | 2/2005 | Nagai |
| 2005/0057929 A1 | 3/2005 | Yano et al. .................. 362/240 |
| 2005/0072981 A1 | 4/2005 | Suenaga |
| 2005/0073840 A1 | 4/2005 | Chou et al. |
| 2005/0082475 A1 | 4/2005 | Doan ........................... 250/307 |
| 2005/0093005 A1 | 5/2005 | Ruhnau |
| 2005/0093422 A1 | 5/2005 | Wang |
| 2005/0093430 A1 | 5/2005 | Ibbetson et al. .............. 313/501 |
| 2005/0122018 A1 | 6/2005 | Morris ........................... 313/46 |
| 2005/0122031 A1 | 6/2005 | Itai et al. |
| 2005/0127377 A1 | 6/2005 | Arndt |
| 2005/0141584 A1 | 6/2005 | Ohe et al. ..................... 372/108 |
| 2005/0179041 A1 | 8/2005 | Harbers et al. ................. 257/80 |
| 2005/0179376 A1 | 8/2005 | Fung et al. |
| 2005/0225976 A1 | 10/2005 | Zampini et al. |
| 2005/0247944 A1 | 11/2005 | Haque ............................ 257/79 |
| 2005/0276053 A1 | 12/2005 | Nortrup et al. ............... 362/294 |
| 2006/0006406 A1 | 1/2006 | Kim et al. .................... 257/100 |
| 2006/0017402 A1 | 1/2006 | McKinney et al. |
| 2006/0022212 A1 | 2/2006 | Waitl |
| 2006/0039143 A1 | 2/2006 | Katoh et al. ................. 362/244 |
| 2006/0049477 A1 | 3/2006 | Arndt |
| 2006/0049782 A1 | 3/2006 | Vornsand et al. |
| 2006/0102914 A1 | 5/2006 | Smits et al. .................... 257/98 |
| 2006/0105478 A1 | 5/2006 | Camras et al. ................. 438/22 |
| 2006/0105484 A1 | 5/2006 | Basin |
| 2006/0108594 A1 | 5/2006 | Iwasaki et al. |
| 2006/0139580 A1 | 6/2006 | Conner ........................... 353/98 |
| 2006/0157828 A1 | 7/2006 | Sorg |
| 2006/0163589 A1 | 7/2006 | Fan et al. ....................... 257/88 |
| 2006/0180818 A1 | 8/2006 | Nagai et al. |
| 2006/0258028 A1 | 11/2006 | Paolini et al. ................. 438/22 |
| 2006/0262524 A1 | 11/2006 | Kah, Jr. |
| 2006/0289878 A1 | 12/2006 | Brunner et al. ................. 257/89 |
| 2007/0013057 A1* | 1/2007 | Mazzochette ................ 257/723 |
| 2007/0030676 A1 | 2/2007 | Ichihara et al. |
| 2007/0046176 A1 | 3/2007 | Bukescov et al. |
| 2007/0109779 A1 | 5/2007 | Sekiguchi et al. |
| 2007/0115670 A1 | 5/2007 | Roberts et al. |
| 2007/0139920 A1* | 6/2007 | Van De Ven et al. ......... 362/235 |
| 2007/0189017 A1 | 8/2007 | Hofmann |
| 2007/0223219 A1 | 9/2007 | Medendorp |
| 2007/0247414 A1 | 10/2007 | Roberts ......................... 345/102 |
| 2007/0247855 A1 | 10/2007 | Yano |
| 2007/0252924 A1* | 11/2007 | Haga et al. ..................... 349/68 |
| 2007/0257272 A1 | 11/2007 | Hutchins ........................ 257/98 |
| 2007/0267983 A1 | 11/2007 | Van De Ven et al. |
| 2007/0269586 A1 | 11/2007 | Leatherdale |
| 2007/0278503 A1 | 12/2007 | Van De Ven et al. |
| 2007/0278934 A1 | 12/2007 | Van de Ven et al. |
| 2007/0279903 A1 | 12/2007 | Negley et al. |
| 2007/0291467 A1 | 12/2007 | Nagai et al. .................... 362/84 |
| 2007/0295972 A1 | 12/2007 | Tsai et al. |
| 2007/0295975 A1 | 12/2007 | Omae ............................. 257/89 |
| 2008/0024696 A1* | 1/2008 | Arai et al. ....................... 349/62 |
| 2008/0043444 A1 | 2/2008 | Hasegawa ..................... 361/717 |
| 2008/0074029 A1 | 3/2008 | Suehiro |
| 2008/0074885 A1 | 3/2008 | Brands et al. |
| 2008/0084685 A1 | 4/2008 | Van De Ven et al. |
| 2008/0084701 A1 | 4/2008 | Van De Ven et al. |
| 2008/0100774 A1 | 5/2008 | Jeon et al. |
| 2008/0106895 A1 | 5/2008 | Van De Ven et al. ......... 362/231 |
| 2008/0106907 A1 | 5/2008 | Trott et al. |
| 2008/0112164 A1* | 5/2008 | Teshirogi ...................... 362/231 |
| 2008/0112168 A1 | 5/2008 | Pickard et al. |
| 2008/0128735 A1 | 6/2008 | Yoo |
| 2008/0130285 A1 | 6/2008 | Negley et al. |
| 2008/0137357 A1* | 6/2008 | Friedrichs et al. ............ 362/507 |
| 2008/0142816 A1* | 6/2008 | Bierhuizen et al. ............. 257/82 |
| 2008/0151527 A1 | 6/2008 | Ueno |
| 2008/0170396 A1 | 7/2008 | Yuan et al. .................... 362/244 |
| 2008/0174996 A1 | 7/2008 | Lu ................................. 362/235 |
| 2008/0186702 A1 | 8/2008 | Camras et al. |
| 2008/0203415 A1 | 8/2008 | Thompson et al. |
| 2008/0204366 A1* | 8/2008 | Kane et al. ...................... 345/44 |
| 2008/0225520 A1* | 9/2008 | Garbus .......................... 362/231 |
| 2008/0232079 A1* | 9/2008 | Awazu .............................. 362/3 |
| 2008/0238335 A1 | 10/2008 | Lee |
| 2008/0239722 A1 | 10/2008 | Wilcox ......................... 362/268 |
| 2008/0278655 A1 | 11/2008 | Moon ............................ 349/58 |
| 2008/0285258 A1* | 11/2008 | Oku et al. ..................... 362/231 |
| 2009/0008662 A1 | 1/2009 | Ashdown et al. |
| 2009/0050907 A1 | 2/2009 | Yuan et al. |
| 2009/0050908 A1* | 2/2009 | Yuan et al. ...................... 257/88 |
| 2009/0160363 A1 | 6/2009 | Negley |
| 2009/0195189 A1 | 8/2009 | Zampini et al. |
| 2009/0201679 A1 | 8/2009 | Konaka ......................... 362/235 |
| 2009/0212717 A1* | 8/2009 | Trattler ......................... 315/297 |
| 2009/0231832 A1 | 9/2009 | Zukauskas et al. ............. 362/84 |
| 2009/0257240 A1 | 10/2009 | Koike ........................... 362/538 |
| 2009/0316073 A1 | 12/2009 | Chen et al. ..................... 349/64 |
| 2010/0014290 A1 | 1/2010 | Wilcox ......................... 362/244 |
| 2010/0025700 A1 | 2/2010 | Jung et al. ...................... 257/89 |
| 2010/0046231 A1 | 2/2010 | Medinis ........................ 362/294 |
| 2010/0079059 A1 | 4/2010 | Roberts et al. |
| 2010/0149783 A1 | 6/2010 | Takenaka et al. ............... 362/84 |
| 2010/0302786 A1 | 12/2010 | Wilcox ......................... 362/327 |
| 2011/0001149 A1 | 1/2011 | Chan et al. |
| 2011/0037084 A1 | 2/2011 | Sekii .............................. 257/89 |
| 2011/0075428 A1 | 3/2011 | Chen ......................... 362/311.02 |
| 2011/0095311 A1 | 4/2011 | Marchl et al. |
| 2011/0164425 A1 | 7/2011 | Chen ......................... 362/311.06 |
| 2011/0222280 A1 | 9/2011 | Kim .............................. 362/235 |
| 2011/0242807 A1 | 10/2011 | Little, Jr. ...................... 362/235 |
| 2012/0075858 A1 | 3/2012 | Hsieh ........................ 362/249.02 |
| 2012/0134154 A1 | 5/2012 | Marchl et al. |

FOREIGN PATENT DOCUMENTS

| | | |
|---|---|---|
| CN | 1470072 | 1/2004 |
| CN | 1470072 A | 1/2004 |
| CN | 1512601 A | 7/2004 |
| CN | 1581527 A | 2/2005 |
| CN | 1591924 A | 3/2005 |
| CN | 1641899 A | 7/2005 |
| CN | 1667845 A | 9/2005 |
| CN | 1679168 A | 10/2005 |
| CN | 1910762 A | 2/2007 |
| CN | 1983590 A | 6/2007 |
| CN | 1983590 A | 6/2007 |
| CN | 101217840 | 7/2008 |
| CN | 101253813 | 8/2008 |
| CN | 201119078 | 9/2008 |
| CN | 101288341 | 10/2008 |
| CN | 101271674 | 12/2010 |
| DE | 2315709 | 3/1973 |
| DE | 19848078 | 4/2000 |
| DE | 10353293 | 6/2005 |
| DE | 102005059362 | 9/2006 |
| DE | 102005028403 A1 * | 12/2006 |
| EP | 1005085 A2 | 5/2000 |
| EP | 1187226 A1 | 3/2002 |
| EP | 1187227 | 3/2002 |
| EP | 1187228 | 3/2002 |
| EP | 1521313 | 4/2005 |
| EP | 2 056 363 | 5/2009 |
| EP | 2337072 A2 | 6/2011 |
| EP | 2341280 A2 | 7/2011 |
| JP | 6284942 | 5/1987 |
| JP | 03209781 | 12/1991 |
| JP | 0545812 | 6/1993 |
| JP | 09246602 | 9/1997 |
| JP | 10012915 | 1/1998 |
| JP | 10261821 | 9/1998 |

(56) References Cited

FOREIGN PATENT DOCUMENTS

| JP | 2001000043 | 1/2001 |
|---|---|---|
| JP | 2001057446 | 2/2001 |
| JP | 2001351404 | 12/2001 |
| JP | 2002184207 | 6/2002 |
| JP | 2002184207 A | 6/2002 |
| JP | 2003-168305 | 6/2003 |
| JP | 2003168305 | 6/2003 |
| JP | 2003168305 A | 6/2003 |
| JP | 2004095580 | 3/2004 |
| JP | 2004512687 | 4/2004 |
| JP | 2004266168 | 9/2004 |
| JP | 2005142311 | 6/2005 |
| JP | 2005158957 | 6/2005 |
| JP | 20051742311 | 6/2005 |
| JP | 2005-228695 | 8/2005 |
| JP | 2005228695 | 8/2005 |
| JP | 2005228695 A | 8/2005 |
| JP | 2006019598 | 1/2006 |
| JP | 2006054329 | 2/2006 |
| JP | 2006054329 A | 2/2006 |
| JP | 2006114854 | 4/2006 |
| JP | 2006-128512 | 5/2006 |
| JP | 2006128512 | 5/2006 |
| JP | 2006173271 | 6/2006 |
| JP | 2006261039 | 9/2006 |
| JP | 2006261375 | 9/2006 |
| JP | 2006294898 | 10/2006 |
| JP | 2006344690 | 12/2006 |
| JP | 2007049172 | 2/2007 |
| JP | 200759260 | 3/2007 |
| JP | 2007059207 | 3/2007 |
| JP | 2007067103 | 3/2007 |
| JP | 2007112134 | 5/2007 |
| JP | 200751921 | 7/2007 |
| JP | 2007189239 | 7/2007 |
| JP | 2007519221 | 7/2007 |
| JP | 2007227679 | 9/2007 |
| JP | 2007251214 | 9/2007 |
| JP | 2007529105 | 10/2007 |
| JP | 2007324608 | 12/2007 |
| JP | 200810691 | 1/2008 |
| JP | 200828171 | 2/2008 |
| JP | 2008505433 | 2/2008 |
| JP | 2008123818 | 5/2008 |
| JP | 2008128486 | 9/2008 |
| JP | 2008252262 | 10/2008 |
| JP | 2010511978 | 4/2010 |
| JP | 2011521469 | 7/2011 |
| TW | 540163 | 7/2003 |
| TW | 540163 B | 7/2003 |
| TW | 200525775 | 8/2005 |
| TW | 200633265 | 9/2006 |
| TW | 200620718 | 10/2007 |
| TW | 200827618 | 7/2008 |
| TW | 1404226 | 8/2013 |
| WO | WO9931737 | 6/1999 |
| WO | WO0217405 | 2/2002 |
| WO | WO0233756 | 4/2002 |
| WO | WO 02/097884 A1 | 12/2002 |
| WO | WO 02097884 A1 | 12/2002 |
| WO | WO03019072 | 3/2003 |
| WO | WO2004044877 | 5/2004 |
| WO | WO2005013365 A2 | 2/2005 |
| WO | WO 2005013365 A2 | 2/2005 |
| WO | WO2005043627 A1 | 5/2005 |
| WO | WO 2006/001221 A1 | 1/2006 |
| WO | WO2006001221 | 1/2006 |
| WO | WO2006013800 | 2/2006 |
| WO | WO2006016326 | 2/2006 |
| WO | WO2006054228 A2 | 5/2006 |
| WO | WO2006054228 A3 | 5/2006 |
| WO | WO 2006/068297 A1 | 6/2006 |
| WO | WO2006068297 | 6/2006 |
| WO | WO2006068297 A1 | 6/2006 |
| WO | WO2006111805 | 10/2006 |
| WO | WO2006135005 | 12/2006 |
| WO | WO2007055455 | 5/2007 |
| WO | WO2007121486 A2 | 10/2007 |
| WO | WO2007126720 A2 | 11/2007 |
| WO | WO 2007/138695 | 12/2007 |
| WO | WO 2008/003176 | 1/2008 |
| WO | WO 2009/157999 A1 | 12/2009 |
| WO | WO201013372 | 11/2010 |
| WO | WO2010133772 | 11/2010 |

OTHER PUBLICATIONS

U.S. Appl. Nos. 11/656,759; 11/899,790 "Wafer Level Phosphor Coating Method and Devices Fabricated Utilizing Method".
U.S. Appl. No. 11/473,089, "Close Loop Electrophoretic Deposition of Semiconductor Devices".
U.S. Appl. No. 61/041,404, "Solid State Lighting Devices and Methods of Manufacturing Same".
U.S. Appl. No. 60/130,411, "Light Source With Near Field Mixing".
U.S. Appl. No. 61/037,365.
CREE Lighting Solutions, LR6, Data Sheet.
CREE XLAMP® LEDS XR-E and XR-C LED Binning and Labeling 2007 data sheet pp. 1-11.
Office Action from U.S. Appl. No. 12/156,995, dated: Nov. 17, 2010.
EPO Communication Pursuant to Rule 161(1) and 162 EPC for European Patent Application No. 09750906.1 dated Feb. 1, 2011.
International Search Report and Written Opinion for PCT/US2009/001628 dated Dec. 3, 2009.
EPO Communication Pursuant to Rule 161(1) and 162 EPC for European Patent Application No. 09758647.3 dated Jan. 24, 2011.
International Search Report and Written Opinion for PCT/US2009/002155 dated Aug. 6, 2009.
International Search Report and Written Opinion for PCT/US2010/003168 mailed Apr. 26, 2011.
Summary of Notice of Reasons for Rejection for Japanese Patent Application No. 2007-228699 mailed May 10, 2011.
International Search Report and Written Opinion for PCT Application No. PCT/US2010/003190 mailed Mar. 31, 2011.
Office Action from U.S. Appl. No. 12/156,995, dated: Mar. 10, 2010.
Response to Office Action from U.S. Appl. No. 12/156,995, filed Sep. 10, 2010.
Office Action from U.S. Appl. No. 12/629,735, dated: Sep. 22, 2010.
Response to Office Action from U.S. Appl. No. 12/629,735, filed Dec. 22, 2010.
Office Action from U.S. Appl. No. 12/629,735, dated: Mar. 10, 2011.
Search Report from Chinese Patent Application No. 200980125244.X, dated Nov. 5, 2012.
Second Office Action from Chinese Patent Application No. 200980125244.X, dated Nov. 26, 2012.
JP 2001 060072A, Abstract, Matsushita Electric Ind. Co Ltd., Mar. 6, 222001.
Lamina, Inc., Titan Turbo™ LED Light Engines, Data Sheet, 2008.
Cree, Inc. Cree® XLamp® XR-E and XR-C LED Data Sheet, 2007, pp. 1-11.
Cree, Inc. Cree® EZ1000™ EZBright LED Data Sheet, 2006,pp. 1-6.
Cree, Inc. Cree® EZ700™ EZBright LED Data Sheet, 2006, pp. 1-6.
Nichia Corp. White LED Part No. NSPW300BS, Specification for Nichia White LED, Model NSPW300BS., Jan. 14, 2004.
Nicha Corp., White LED Part No. NSPW312BS, Specification for Nichia White LED, Model NSPW312BS. Jan. 14, 2004.
Kim J.K et al. "Strongly Enhanced Phosphor Efficiency in GaInN White Light-Emitting Diodes Using Remote Phosphor Configuration and Diffuse Reflector Cup" Japanese Journal of Applied Physics, Japan Society of Applied Physics, Tokyo, JP, vol. 44, No. 20-23, Jan. 1, 2005 XP-001236966, pp. 649-651.
Notification of National Application Upon the Preliminary Examination of a Patent Application for Chinese Patent Application No. 200980125244.X dated May 25, 2011.
Notice of Reasons for Rejection for Japanese Patent Application No. 2008-221738 dated Aug. 3, 2011.
Office Action for U.S. Appl. No. 12/883,979, mailed on Sep. 12, 2011.

(56) References Cited

OTHER PUBLICATIONS

Response to Office Action Sep. 12, 2011, U.S. Appl. No. 12/883,979, filed Feb. 7, 2012.
Notice of Allowance from U.S. Appl. No. 12/883,979, mailed Mar. 19, 2012.
Office Action for U.S. Appl. No. 12/156,995, mailed on Aug. 30, 2011.
Response to Office Action mailed Aug. 30, 2011, U.S. Appl. No. 12/156,995, filed Nov. 29, 2011.
Ottice Action for U.S. Appl. No. 11/982,276, mailed Feb. 22, 2012.
Office Action from U.S. Appl. No. 12/156,995, dated: Apr. 12, 2012.
International Search Report and Written Opinion from PCT/US2011/001200, dated Apr. 27, 2012.
First Office Action for Chinese Patent Application No. 201230001815.3, dated Apr. 11, 2012.
Summary of Notice of Reasons for Rejection from Japanese Patent Application No. 2007-228699, dated May 8, 2012.
Notice of Reasons for Rejection from Japanese Patent Application No. 2008-221738, dated May 29, 2012.
First Office Action for Chinese Patent Application No. 200980125244.X, dated May 28, 2012.
Notice of Reasons for Rejection in Japanese Patent Application No. 2011-512442, dated Aug. 7, 2012.
Reason for Rejection for Japanese Patent Application No. 2011-510484, dated Aug. 7, 2012.
First Office Action from Chinese Patent Application 200980142352.8, dated Aug. 27, 2012 (received Nov. 2, 2012).
PCT Preliminary Report and Written Opinion from PCT Appl. No. PCT/US2011/001200, dated Jan. 17, 2013.
Second Office Action from Chinese Patent Application No. 200980142352.8, dated May 6, 2013.
Third Office Action from Chinese Patent Application No. 200980125244.X, dated May 31, 2013.
Office Action from U.S. Appl. No. 12/156,995, dated Apr. 12, 2012.
Office Action from U.S. Appl. No. 11/982,276, dated Aug. 7, 2012.
Response to OA from U.S. Appl. No. 12/156,995, filed Sep. 19, 2012.
Response to OA from U.S. Appl. No. 11/982,276, filed Sep. 25, 2012.
Office Action from U.S. Appl. No. 12/643,670, dated Oct. 1, 2012.
Office Action from U.S. Appl. No. 11/982,276, dated Oct. 10, 2012.
Office Action from U.S. Appl. No. 13/489,035, dated Jan. 22, 2013.
Office Action from U.S. Appl. No. 12/862,690, dated Jan. 24, 2013.
Office Action from U.S. Appl. No. 13/029,005, dated Jan. 24, 2013.
Response to OA from U.S. Appl. No. 12/643,670, filed Dec. 21, 2012.
Response to OA from U.S. Appl. No. 11/982,276, filed Oct. 31, 2012.
Response to OA from U.S. Appl. No. 13/489,035, filed Jun. 5, 2013.
Response to OA from U.S. Appl. No. 12/862,640, filed Apr. 17, 2013.
Response to OA from U.S. Appl. No. 13/029,005, filed Apr. 17, 2013.
Office Action from U.S. Appl. No. 13/177,415, dated Jan. 25, 2013.
Office Action from U.S. Appl. No. 12/629,735, dated Feb. 8, 2013.
Office Action from U.S. Appl. No. 12/544,131, dated Jan. 15, 2013.
Office Action from U.S. Appl. No. 12/643,705, dated Jun. 13, 2012.
Response to OA from U.S. Appl. No. 13/177,415, filed Apr. 23, 2013.
Response to OA from U.S. Appl. No. 12/629,735, filed Jun. 10, 2013.
Response to OA from U.S. Appl. No. 12/544,131, filed Mar. 13, 2013.
Response to OA from U.S. Appl. No. 12/643,705, filed Sep. 10, 2012.
Office Action from U.S. Appl. No. 11/982,276, dated May 29, 2013.
Office Action from U.S. Appl. No. 12/862,640, dated Apr. 30, 2013.
Office Action from U.S. Appl. No. 13/177,415, dated May 2, 2013.
Notice of Reasons for Rejection from Japanese Patent Application No. 2011-533175, dated Apr. 2, 2013.
Examination Report from European Patent Appl. No. 10 757 645.6-1802, dated Jun. 28, 2013.
Decision of Rejection and Decision of Declining Amendment from Japanese Patent appl. No. 2011-512442, dated Jun. 19, 2013.
Decision of Rejection from Japanese Patent Application No. 2008-221738, dated Feb. 26, 2013.
Decision of Dismissal of Amendment from Japanese Patent Application No. 2008-221738, dated Feb. 26, 2013.
Office Action from Japanese Patent Application No. 2011-512442, dated Feb. 22, 2013.

Satoshi Emoto, "How to make Mobile", [on line], May 30, 2001, ITmedia (searched on Feb. 15, 2013), internet URL:http//www.itmedia.co.jp/mobile/rensai/howtomake/04.
Office Action from Japanese Patent Appl. No. 2007-228699, dated Mar. 6, 2013.
Office Action from U.S. Appl. No. 12/156,995, dated May 7, 2014.
Office Action from U.S. Appl. No. 13/177,415, dated May 7, 2014.
Office Action from U.S. Appl. No. 13/971,547, dated May 8, 2014.
Response to Office Action U.S. Appl. No. 13/971,547, filed Jul. 11, 2014.
Notice of Reasons for Rejection from Japanese Patent Appl. No. 2012-544480, dated Oct. 29, 2013.
Office Action from U.S. Appl. No. 11/982,276, dated Oct. 25, 2013.
Office Action from U.S. Appl. No. 13/971,597, dated Nov. 6, 2013.
Interrogation from Japanese Patent Appl. No. 2008-221738, dated Sep. 10, 2013.
First Office Action from Chinese Patent Appl. No. 200960125251, dated Aug. 8, 2013 (Received Oct. 4, 2013).
Search Report from Chinese Patent Appl. No. 200980125251, dated Jul. 31, 2013 (Received Oct. 14, 2013).
Office Action from U.S. Appl. No. 12/629,735, dated Sep. 18, 2013.
Office Action from U.S. Appl. No. 13/489,035, dated Aug. 5, 2013.
Response to OA from U.S. Appl. No. 13/489,035, filed Oct. 7, 2013.
Office Action from U.S. Appl. No. 12/156,995, dated Aug. 28, 2013.
Office Action from U.S. Appl. No. 12/643,670, dated Jun. 25, 2013.
Office Action from U.S. Appl. No. 13/177,415, dated Oct. 7, 2013.
Notice of Reconsideration from Japanese Patent Appl. No. 2008-221738, dated Jul. 9, 2013.
International Search Report and Written Opinion for Appl. No. PCT/US2013/038391, dated Aug. 8, 2013.
Office Action from Japanese Patent Appl. No. 2011-533175, dated Jul. 25, 2013.
Fourth Office Action from Chinese Patent Appl. No. 2009801423528, dated May 29, 2014.
Decision of Rejection from Japanese Patent Appl. No. 2007-228699, dated Mar. 18, 2014.
European Search Report from European Patent appl. No. 08252829.0, dated Feb. 28, 2014.
Office Action from Taiwanese Patent appl. No. 098109589, dated Feb. 18, 2014.
European Examination from European Patent appl. No. 11748482.4-1757, dated Feb. 21, 2014.
Office Action from U.S. Appl. No. 12/156,995, dated Jan. 24, 2014.
Decision of Rejection from Chinese Patent Application No. 200980125244.X, dated Jan. 13, 2014.
Office Action from Japanese Patent Appl. No. 2013-064671, dated Feb. 3, 2014.
Appeal Board's Questioning from Japanese Patent Appl. No. 2011-512442, dated Jan. 17, 2014.
Extended European Search Report from European Patent Appl. No. 13197857.9, dated Feb. 7, 2014.
European Search Report from European Patent Appl. No. 10757645.6, dated Feb. 2, 2014.
Office Action from Japanese Patent Appl. No. 2008-221738 dated Apr. 8, 2014.
Second Office Action from Chinese Patent Appl. No. 200980125251.X dated Apr. 3, 2014.
Office Action from Japanese Patent Appl. No. 2011-533175 dated Apr. 28, 2014.
Office Action from U.S. Appl. No. 12/643,670, dated Mar. 31, 2014.
Third Office Action and Search Report from Chinese Patent Appl. No. 2009801142352.8, dated Nov. 26, 2013.
Office Action and Search Report from Taiwanese Patent Appl. No. 098109421, dated Aug. 22, 2014.
Notice of Reasons for Rejection from Japanese Patent Appl. No. 2012-544480, dated Aug. 5, 2014.
Office Action from Taiwanese Patent Appl. No. 098109589, dated Jul. 11, 2014.
Office Action from Taiwanese Patent Appl. No. 098136067, dated Jun. 26, 2014.
Office Action from U.S. Appl. No. 11/982,276, dated Apr. 16, 2015.
Office Action from U.S. Appl. No. 12/643,670, dated Apr. 24, 2015.
Office Action from U.S. Appl. No. 12/156,995, dated May 5, 2015.

(56) References Cited

OTHER PUBLICATIONS

Office Action from Japanese Patent Appl. No. 2011-533175, dated Apr. 28, 2015.
Office Action from Taiwanese Patent Appl. No. 099145035, dated Apr. 24, 2015.
Summons to attend oral hearing from European Appl. No. 10757645.6-1802, dated Apr. 30, 2015.
Office Action from Japanese Appl. No. 2013-064671, dated Jun. 2, 2015.
Office Action from Taiwanese Appl. No. 098109421, dated Apr. 22, 2015.
Decision of Rejection and Non Acceptance of Amendment from Japanese Patent Appl. No. 2012-544480, dated May 12, 2015.
Fifth Office Action from Chinese Appl. No. 2009801423528, dated Dec. 31, 2014.
Second Office Action from Chinese Appl. No. 201080062058.9, dated Dec. 31, 2014.
Office Action from U.S. Appl. No. 12/156,995, dated Dec. 8, 2014.
Office Action from U.S. Appl. No. 12/629,735, dated Dec. 18, 2014.
Office Action from U.S. Appl. No. 13/833,272, dated Dec. 31, 2014.
Office Action from U.S. Appl. No. 13/177,415, dated Jan. 8, 2015.
Office Action from Taiwanese Appl. No 098136067, dated Jan. 21, 2015.
Office Action from Korean Appl. No. 10-2011-7000240, dated Feb. 17, 2015.
First Office Action and Search Report from Chinese Appl. No. 2011800428038, dated Jan. 21, 2015.
First Office Action from Chinese Patent Appl. No. 201210492856.6, dated Jan. 5, 2015.
Notification of Reexamination from Chinese Patent Appl. No. 200980125244X, dated Mar. 2, 2015.
Office Action from Korean Patent Appl. No. 10-2010-7028850, dated Feb. 17, 2015.
Third Office Action from Chinese Appl. No. 200980125251.X, dated Oct. 31, 2014.
Pretrial Report from Japanese Appl. No. 2011-533175, dated Oct, 8. 2014.
Office Action from Taiwanese Patent Appl. No. 099105210, dated Oct. 20, 2014.
Reexamination Report from Japanese Appl. No. 2007-228699, dated Nov. 7, 2014.
Appeal Decision from Japanese Appl. No. 2013-12017, dated Nov. 25, 2014.
Reasons for Rejection from Japanese Appl. No. 2013-064671, dated Nov. 18, 2014.
International Preliminary Report from Appl. No. PCT/US2013/038391, dated Nov. 25, 2014.
Office Action from U.S. Appl. No. 12/156,995, dated Sep. 26, 2014.
Response to OA from U.S. Appl. No. 12/156,995, filed Nov. 19, 2014.
Office Action from U.S. Appl. No. 12/643,670, dated Oct. 15, 2014.
Office Action from U.S. Appl. No. 11/982,276, dated Oct. 23, 2014.
Office Action from U.S. Appl. No. 13/833,272, filed Jan. 6, 2016.
Office Action from U.S. Appl. No. 11/982,276, filed Feb. 4, 2016.
Office Action from U.S. Appl. No. 12/156,995, filed Feb. 16, 2016.
Office Action from U.S. Appl. No. 12/156,995, dated Sep. 4, 2015.
Office Action from U.S. Appl. No. 13/833,272, dated Sep. 24, 2015.
Office Action from U.S. Appl. No. 13/177,415, dated Oct. 16, 2015.
Decision of Rejection from Chinese Patent Appl. No. 200980142352.8, dated Jul. 14, 2015.
Final Notice for Reasons for Rejection from Japanese Patent appl. No. 2013-064671, dated Jun. 2, 2015 (translations).
Office Action from U.S. Appl. No. 13/177,415, dated Jun. 18, 2015.
Response to OA from Patent Appl. No. 13/177,415, filed Aug. 17, 2015.
Office Action from U.S. Appl. No. 12/829,735, dated Jul. 15, 2015.
Decision of Rejection from Japanese Patent Appl. No. 2013-064671, dated Dec. 28, 2015.
Examination Report from European Patent appl. No. 11 748 482.4-1757, dated Nov. 16, 2015.
Decision of Reexamination from Chinese Patent Appl. No. 200980142352.8, dated Dec. 2, 2015.
Notification of Filing Receipt (Reexamination) from Chinese Patent Appl. No. 200980142352.8, dated Nov. 10, 2015.
Trial Decision from Japanese Patent Appl. No. 2011-533175, dated Oct. 27, 2015.
Notification of Reexamination from Chinese Patent Appl. No. 200980125244X, dated Oct. 15, 2015.
Decision to Refuse a European Patent Application, European Patent Appl. No. 10757645.6, dated Oct. 27, 2015.
PCT International Search Report and Written Opinion from related PCT Application PCT/US2009/005758, dated: Feb. 9, 2010.
Yang Chin-Chieh et al.: "Highly Stable Three-Band White Light From an InGaN-Based Blue Light-Emitting Diode Chip Precoated with (oxy) Nitride Green/Red Phosphors", Applied Physics Letters, AIP, American Institute of Physics, Melville, NY, US, vol. 90, No. 12, Mar. 20, 2007, pp. 123503-123503, XP012093758.
Office Action for Japanese Application No. 2007-228699; Dated Apr. 1, 2016.
Notice of Allowance for Application No. 10757645.6; Dated Apr. 15, 2016.
Decision of Grant for Application No. 2012-544480; Dated May 31, 2016.
Notice of Issuance for Chinese Application No. 20098012544, Dated Jun. 16, 2016.

\* cited by examiner

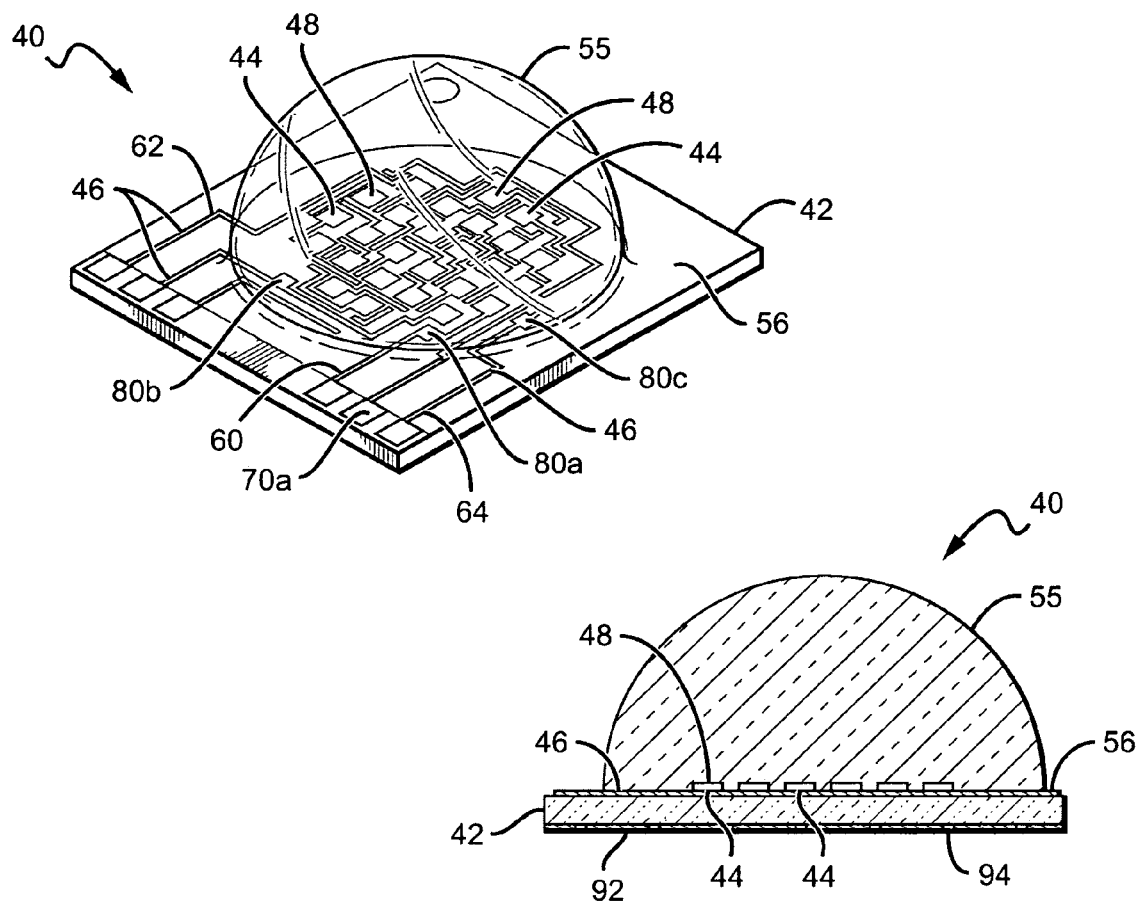
FIG. 4a
FIG. 4b
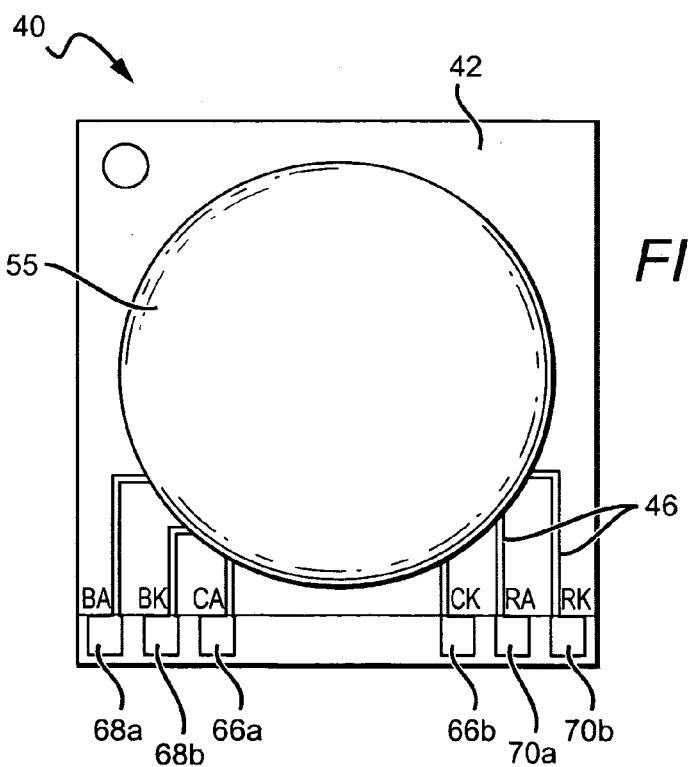
FIG. 4c

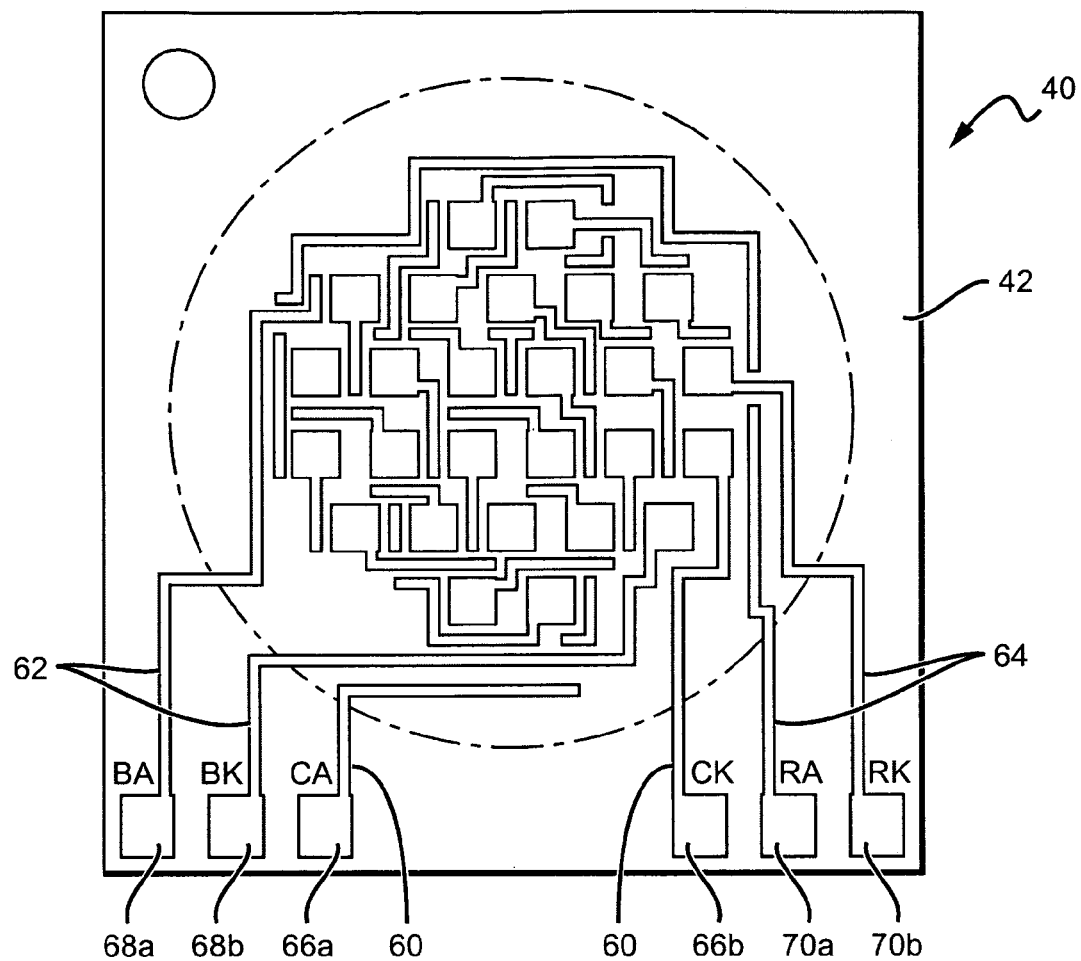
FIG. 6
FIG. 9
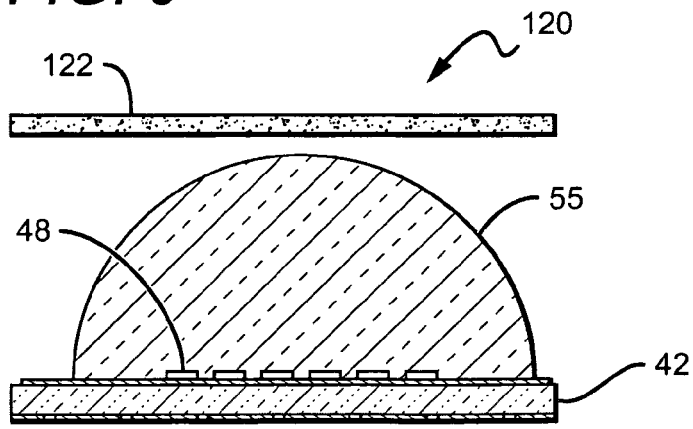

LIGHT EMITTER ARRAY

BACKGROUND OF THE INVENTION

1. Field of the Invention

This invention relates to solid state lighting and in particular to solid state lighting utilizing a plurality of discrete emitter arranged to promote color mixing.

2. Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

In order to use an LED chip in a circuit or other like arrangement, it is known to enclose an LED chip in a package to provide environmental and/or mechanical protection, color selection, light focusing and the like. An LED package also includes electrical leads, contacts or traces for electrically connecting the LED package to an external circuit. In a typical LED package/component 10 illustrated in FIG. 1, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup 13 may be filled with an encapsulant material 16 which may contain a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected (i.e. some light may be absorbed by the reflector cup due to the less than 100% reflectivity of practical reflector surfaces). In addition, heat retention may be an issue for a package such as the package 10 shown in FIG. 1, since it may be difficult to extract heat through the leads 15A, 15B.

LED component 20 illustrated in FIG. 2 may be more suited for high power operations which may generate more heat. In LED component 20, one or more LED chips 22 are mounted onto a carrier such as a printed circuit board (PCB) carrier, substrate or submount 23. A metal reflector 24 is mounted on the submount 23, surrounds the LED chip(s) 22, and reflects light emitted by the LED chips 22 away from the package 20. The reflector 24 also provides mechanical protection to the LED chips 22. One or more wirebond connections 11 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond.

Other LED components or lamps have been developed that comprise an array of multiple LED packages mounted to a (PCB), substrate or submount. The array of LED packages can comprise groups of LED packages emitting different colors, and specular reflector systems to reflect light emitted by the LED chips. Some of these LED components are arranged to produce a white light combination of the light emitted by the different LED chips. There can be challenges in producing high quality light from different colors emitted by the LED packages. If the light from the packages is not properly mixed, the light output can appear both in the near field and the far field as different colors. Mixing can be difficult when using specular reflectors in that the reflector images the light sources. This can multiply the appearance of different colors of light in both the near and far field.

Techniques for generating white light from a plurality of discrete light sources have been developed that utilize different hues from different discrete light sources, such as those described in U.S. Pat. No. 7,213,940, entitled "Lighting Device and Lighting Method". These techniques mix the light from the discrete sources to provide white light. In some applications, mixing of light occurs in the far field such that when viewed directly the different hued sources of light can be separately identified, but in the far field the light combines to produce light which is perceived as white. One difficulty with mixing in the far field is that the individual discrete sources can be perceived when the lamp or luminaire is viewed directly. Accordingly, the use of only far field mixing may be most appropriate for these lighting applications where the light sources are mechanically obscured from a user's view. However, mechanically obscuring the light sources may result in lower efficiency as light is typically lost by the mechanical shielding.

Different lamp or luminaries have been developed to more efficiently mix light from the discrete sources to minimize their visibility. The LR6 lamp, commercially available from Cree, Inc. (www.creelighting.com) utilizes a "mixing chamber" where light is reflected in a cavity between a lens and the light sources and passes through a diffuser which obscures the individual sources. Thus, the LR6 lamp appears to have a single light source in much the same way as an incandescent lamp appears to have a single source, even though the LR6 lamp utilizes multiple discrete sources. See also U.S. Patent Application Publication Nos. 2007/0267983, 2007/0278503, 2007/0278923, 2008/0084685, 2008/0084701, 2008/0106895, 2008/0106907 and 2008/0112168 for further examples of a "mixing chamber".

While the mixing chamber approach has resulted in very high efficacies for the LR6 lamp of approximately 60 lumens/watt, one drawback of this approach is that a minimum spacing is required between the diffuser lens (which can be a lens and diffuser film) and the light sources. The actual spacing can depend on the degree of diffusion of the lens but, typically, higher diffusion lenses have higher losses than lower diffusion lenses. Thus, the level of diffusion/obscuration and mixing distance are typically adjusted based on the application to provide a light fixture of appropriate depth. In different lamps, the diffuser can be 2 to 3 inches from the discrete light sources, and if the diffuser is closer the light from the light sources may not mix sufficiently. Accordingly, it can be difficult to provide very low profile light fixtures utilizing the mixing chamber approach. One mechanism used in the LR6 for mixing color was to surround the red LEDs with LEDs emitting different colors of light so that no red LED was on the outside edge of the array. This pattern, combined with non-specular reflector and a diffuser resulted in a more uniform appearance of the light when viewing the diffuser and in the far field. However, this also leads to clustering the red LEDs nearer the center of the array, which can lead to a red center in the resulting output beam.

Current LED packages (e.g. XLamp® LEDs provided by Cree, Inc.) can be limited in the level of input power and for some the range is 0.5 to 4 Watts. Many of these conventional LED packages incorporate one LED chip and higher light output is achieved at the assembly level by mounting several of these LED packages onto a single circuit board. FIG. 3 shows a sectional view of one such distributed integrated LED array 30 comprising a plurality of LED packages 32 mounted to a substrate or submount 34 to achieve higher luminous flux. Typical arrays include many LED packages, with FIG. 3 only showing two for ease of understanding. Alternatively, higher flux components have been provided by utilizing arrays of cavities, with a single LED chip mounted in each of the cavities. (e.g. TitanTurbo™ LED Light Engines provided by Lamina, Inc.).

These LED array solutions are less compact than desired as they provide for extended non-light emitting "dead space" between adjacent LED packages and cavities. This dead space provides for larger devices, and can limit the ability to diffuse light from the LED packages and can limit the ability to shape the output beam by a single compact optical element like a collimating lens or reflector into a particular angular distribution. This makes the construction of solid state lighting luminaries that provide for directed or collimated light output within the form factor of existing lamps or even smaller difficult to provide. These present challenges in providing a compact LED lamp structure incorporating an LED component that delivers light flux levels in the 1000 lumen and higher range from a small optical source.

SUMMARY OF THE INVENTION

The present invention provides lamps, luminaries or solid state lighting components having multiple discrete light sources whose light combines to provide the desired emission characteristics. The discrete light sources are arranged pursuant to certain guidelines to promote mixing of light from light sources emitting different colors of light. One embodiment of a solid state lighting component according to the present invention comprises a light emitting diode (LED) component having an array of LED chips. The array has groups of first and second LED chips with the first group of LED chips arranged so that no two of the first group LED chips are directly next to one another in the array. A lens is included over the array.

Another embodiment according to the present invention comprises a light emitting diode (LED) component having an array of LED chips comprising a first group of LED chips and one or more additional groups of LED chips. The first group of LEDs is arranged so that at least three LED chips from the one or more additional groups is adjacent each of the LED chips in the first group. A lens is included over the array.

Another embodiment according to the present invention comprises a light emitting diode (LED) component having an array of LED chips mounted on a submount. The array of LED chips comprises a first group of LED chips and one or more additional groups of LED chips. The array is arranged so that less than fifty percent (50%) of the LED chips in the first group of LED chips is on the perimeter of the array.

Another embodiment according to the present invention comprises a light emitting diode (LED) component having an array of LED chips comprising a first group of LED chips and one or more additional groups of LED chips. The first group of LED chips is arranged so that no two LED chips from the first group are directly next to one another in the array, and so that at least three LED chips from the one or more additional groups is adjacent each of the LED chips in the first group.

Still another embodiment of a light emitting diode (LED) component according to the present invention comprises an array of LED chips having a first group of LED chips and one or more additional groups of LED chips. The array is arranged so that no two LED chips from the first group are directly next to one another in the array, that less than fifty percent (50%) of the LED chips in the first group of LEDs is on the perimeter of the array, and at least three LED chips from the one or more additional groups is adjacent each of the LED chips in the first group.

These and other aspects and advantages of the invention will become apparent from the following detailed description and the accompanying drawings which illustrate by way of example the features of the invention.

BRIEF DESCRIPTION OF THE DRAWINGS

FIG. 4a shows a perspective view of one embodiment of an LED component according to the present invention;

FIG. 4b is a sectional view of side view of the LED component shown in FIG. 4a;

FIG. 4c is a top plan view of the LED component shown in FIG. 4a;

FIG. 4d is a bottom perspective view of the LED component shown in FIG. 4a;

FIG. 4e is a bottom plan view of the LED component shown in FIG. 4a;

FIG. 6 is a top plan view of one embodiment of a die attach pad and interconnect trace arrangement according to the present invention;

FIG. 9 is a side view of another embodiment of an LED component according to the present invention having a diffuser.

DETAILED DESCRIPTION OF THE INVENTION

Figure 1:
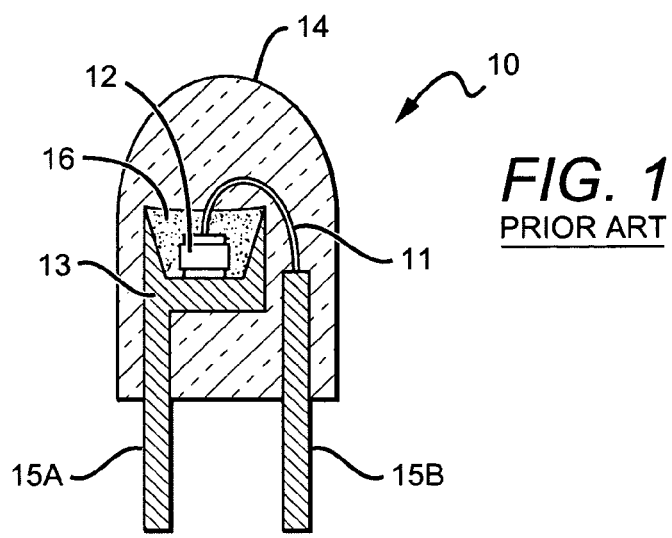
FIG. 1 shows a sectional view of one embodiment of a prior art LED lamp.
Figure 2:
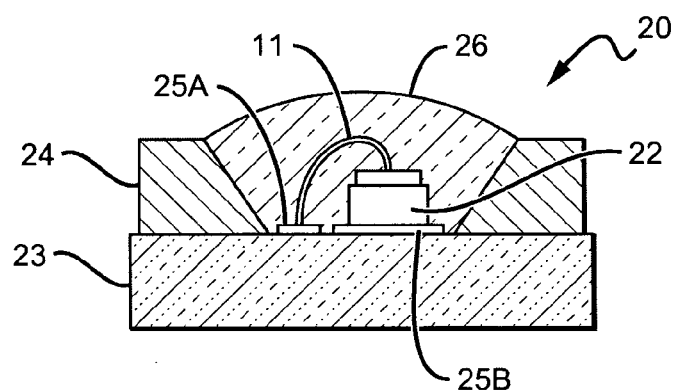
FIG. 2 shows a sectional view of another embodiment of prior art LED lamp.
Figure 3:
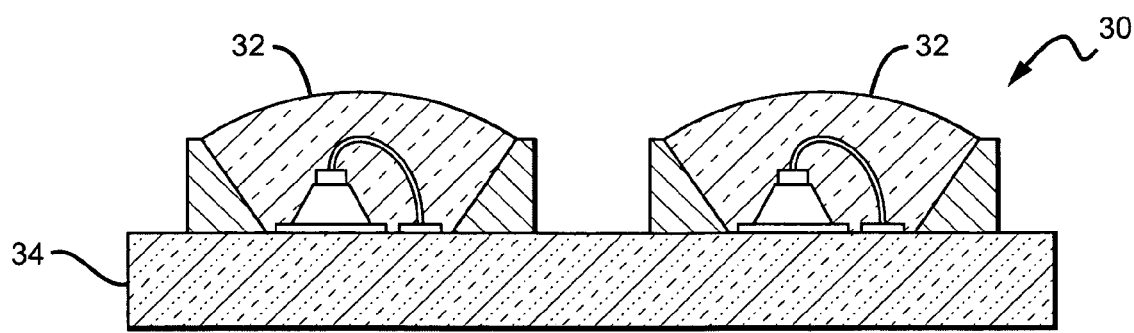
FIG. 3 shows a sectional view of one embodiment of a prior art LED component.
Figure 4D:
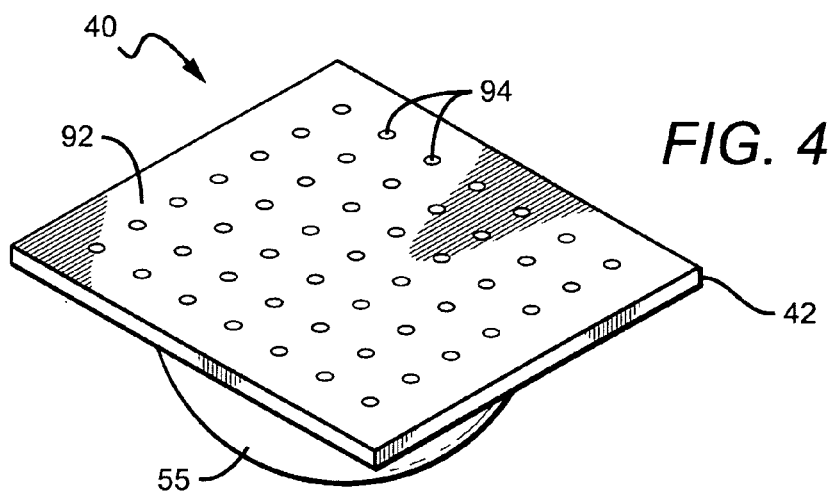
Figure 4E:
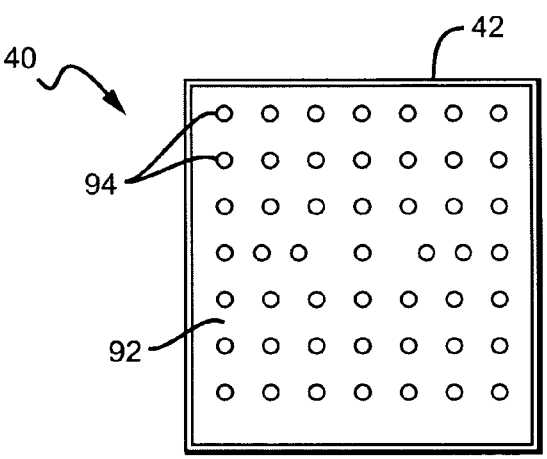

The present invention comprises a solid state lighting component, lamp or luminaire having a plurality or array of discrete light sources comprising groups of light sources emitting at different colors of light. The present invention is described with reference to the LED components utilizing LEDs or LED chips, but it is understood that lighting components according to the present invention can utilize different light sources including other solid state light sources.

LED components according to the present invention illuminate the array of LED chips to emit a color combination of light from the LED chips. In one embodiment an LED component emits a white light combination or mixture of light from its LED chips. The configuration of the particular LED chips in the array can contribute to the ability to mix in the near field and in particular for specular reflector systems, in the far field. Random placement of the LED chips in the array can reduce natural color mixing from the LED chips and may lead to color variation in the output of the lamp. To reduce or eliminate this problem, high levels of diffusion have been used, but high levels of diffusion typically result in optical losses that can reduce the overall emission efficacy of the LED component.

In embodiments according to the present invention natural mixing of the light source emissions is promoted by arranging the LED chips in the array pursuant to certain guidelines. In one embodiment, the array can contain a first group of LED chips emitting at one color of light, and one or more groups of LED chips that emit other colors of light. In one embodiment the LED chips can comprise one group emitting at one color of light and second and third groups of LED chips emitting at other colors of light. The groups of LED chips are arranged to promote natural mixing by arranging the first group of LED chips in different ways in relation to the others of the first group, in relation to positioning in the array, and in relation to the LED chips in the other groups of LED chips. In particular, one, some or all of the following general guidelines apply:

1. No two of the first group of LED chips are arranged directly next to one another;
2. As few as possible of the first group of LED chips are on the edge of the array; and
3. LED chips from the first group have at least three LED chips from the other groups of LED chips adjacent to them.

Different embodiments of LED components according to the present invention can comprise different groups of LED chips emitting many different colors of light. One embodiment of an LED component according to the present invention comprises a first group of LED chips emitting red light, and second and third groups of LED chips each comprising a blue LED covered by a conversion material. The combination of light from the three groups of LED chips produces the desired wavelength of light and the desired color temperature, with the arrangement of the LED chips pursuant to the above guidelines promoting natural color mixing.

It is understood that LED components according to the present invention can also be arranged other ways, and can have additional features, that promote color mixing. In some embodiments, the LED chips in the array can be arranged so that they are tightly packed, which can further promote natural color mixing. The LED components can also comprise different diffusers and reflectors to promote color mixing in the near and far field.

The present invention is described herein with reference to certain embodiments, but it is understood that the invention can be embodied in many different forms and should not be construed as limited to the embodiments set forth herein. In particular, the present invention is described below in regards to certain lighting or LED components having arrays of LEDs or LED chips in different configurations, but it is understood that the present invention can be used for many other lamps having many different array configurations. The components can have different shapes and sizes beyond those shown and different numbers of LEDs can be included in the arrays. Some or all of the LEDs in the arrays can be coated with a down-converter coating that can comprise a phosphor loaded binder ("phosphor/binder coating"), but it is understood that LEDs without a conversion material can also be used.

It is also understood that when an element such as a layer, region or substrate is referred to as being "on", "over" or "coating" another element, it can be directly on, over or coating the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to certain view illustrations that may be schematic illustrations of embodiments of the invention. As such, the actual size and thickness of elements can be different, and variations from the shapes of the illustrations as a result, for example, of manufacturing techniques and/or tolerances are expected. Embodiments of the invention should not be construed as limited to the particular shapes and sizes of the regions illustrated herein but are to include deviations in shapes that result, for example, from manufacturing. A region illustrated or described as square or rectangular can have rounded or curved features due to normal manufacturing tolerances. Thus, the regions illustrated in the figures are schematic in nature and their shapes are not intended to illustrate the precise shape of a region of a device and are not intended to limit the scope of the invention.

FIGS. 4a through 4e show one embodiment of an LED component 40 according to the present invention comprising a submount 42 for holding an array of LED chips, with the submount 42 having die pads 44 and conductive traces 46 on its top surface. LED chips 48 are included that comprise the LED array, with each of the LED chips 48 mounted to a respective one of the die pads 44. The LEDs chips 48 can have many different semiconductor layers arranged in different ways and can emit many different colors in different embodiments according to the present invention. LED structures, features, and their fabrication and operation are generally known in the art and only briefly discussed herein.

The layers of the LEDs chips 48 can be fabricated using known processes with a suitable process being fabrication using metal organic chemical vapor deposition (MOCVD). The layers of the LED chips generally comprise an active layer/region sandwiched between first and second oppositely doped epitaxial layers all of which are formed successively on a growth substrate. LED chips can be formed on a wafer and then singulated for mounting in a package. It is understood that the growth substrate can remain as part of the final singulated LED or the growth substrate can be fully or partially removed.

It is also understood that additional layers and elements can also be included in the LED chips 48, including but not limited to buffer, nucleation, contact and current spreading layers as well as light extraction layers and elements. The active region can comprise single quantum well (SQW), multiple quantum well (MQW), double heterostructure or super lattice structures. The active region and doped layers may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the doped layers are gallium nitride (GaN) and the active region is InGaN. In alternative embodiments the doped layers may be AlGaN, aluminum gallium arsenide (AlGaAs) or aluminum gallium indium arsenide phosphide (AlGaInAsP) or AlInGaP aluminium Indium Galium Phosphide or ZnO Zinc Oxide The growth substrate can be made of many materials such as silicon, glass, sapphire, silicon carbide, aluminum nitride (AlN), gallium nitride (GaN), with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. No. Re. 34,861; U.S. Pat. Nos. 4,946,547; and 5,200,022.

The LED chips 48 can also comprise a conductive current spreading structure and wire bond pads on the top surface, both of which are made of a conductive material and be deposited using known methods. Some materials that can be used for these elements include Au, Cu, Ni, In, Al, Ag or combinations thereof and conducting oxides and transparent conducting oxides. The current spreading structure can comprise conductive fingers arranged in a grid on the LED chips 48 with the fingers spaced to enhance current spreading from the pads into the LED's top surface. In operation, an electrical signal is applied to the pads through a wire bond as described below, and the electrical signal spreads through the fingers of the current spreading structure and the top surface into the LED chips 48. Current spreading structures are often used in LEDs where the top surface is p-type, but can also be used for n-type materials.

Some or all of the LED chips 48 can be coated with one or more phosphors with the phosphors absorbing at least some of the LED light and emitting a different wavelength of light such that the LED emits a combination of light from the LED and the phosphor. As described in detail below, in one embodiment according to the present invention at least some of the LED chips can comprise an LED that emits light in the blue wavelength spectrum with its phosphor absorbing some of the blue light and re-emitting yellow light. These LED chips 48 emit a white light combination of blue and yellow light or a non-white light combination of blue and yellow light. As used herein, the term "white light" refers to light that is perceived as white and is within 7 MacAdam ellipses of the black body locus on a 1931 CIE chromaticity diagram and has a CCT ranging from 2000 K to 10,000 K. In one embodiment the phosphor comprises commercially available YAG:Ce, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for white emitting LED chips include:

$Tb_{3-x}RE_xO_{12}$:Ce(TAG); RE=Y, Gd, La, Lu; or
$Sr_{2-x-y}Ba_xCa_ySiO_4$:Eu.

In other embodiments some of the LED chips can comprise blue emitting LED coated by other phosphors that absorb blue light and emit yellow or green light. Some of the phosphors that can be used for these LED chips include:
Yellow/Green
$(Sr,Ca,Ba) (Al,Ga)_2S_4$:$Eu^{2+}$
$Ba_2(Mg,Zn) Si_2O_7$:$Eu^{2+}$
$Gd_{0.46}Sr_{0.31}Al_{1.23}O_xF_{1.38}$:$Eu^{2+}_{0.06}$
$(Ba_{1-x-y}Sr_xCa_y) SiO_4$:Eu
$Ba_2SiO_4$:$Eu^{2+}$ The LED chips 48 emitting red light can comprise LED structures and materials that permit emission of red light directly from the active region. Alternatively, in other embodiments the red emitting LED chips 48 can comprise LEDs covered by a phosphor that absorbs the LED light and emits a red light. Some phosphors appropriate for this structures can comprise:
Red
$Lu_2O_3$:$Eu^{3+}$
$(Sr_{2-x}La_x) (Ce_{1-x}Eu_x)O_4$
$Sr_2Ce_{1-x}Eu_xO_4$
$Sr_{2-x}Eu_xCeO_4$
$SrTiO_3$:$Pr^{3+}$,$Ga^{3+}$
$CaAlSiN_3$:$Eu^{2+}$
$Sr_2Si_5N_8$:$Eu^{2+}$ Each of the phosphors described above exhibits excitation in the desired emission spectrum, provides a desirable peak emission, has efficient light conversion, and has acceptable Stokes shift. It is understood, however, that many other phosphors can used in combination with other LED colors to achieve the desired color of light.

The LED chips 48 can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. Alternatively the LEDs can be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference. It is understood that LED packages according to the present invention can also have multiple LEDs of different colors, one or more of which may be white emitting.

The submount 42 can be formed of many different materials with a preferred material being electrically insulating, such as a dielectric. The submount 42 can comprise ceramic such as alumina, aluminum nitride, silicon carbide, or a polymeric material such as polyimide and polyester etc. In the preferred embodiment, the submount material has a high thermal conductivity such as with aluminum nitride and silicon carbide. In other embodiments the submount 42 can comprise highly reflective material, such as reflective ceramic or metal layers like silver, to enhance light extraction from the component. In other embodiments the submount 42 can comprise a printed circuit board (PCB), sapphire, silicon carbide or silicon or any other suitable material, such as T-Clad thermal clad insulated substrate material, available from The Bergquist Company of Chanhassen, Minn. For PCB embodiments different PCB types can be used such as standard FR-4 PCB, metal core PCB, or any other type of printed circuit board. The size of the submount 42 can vary depending on different factors, with one being the size and number of LED chips 48.

The die pads 44 and conductive traces 46 can comprise many different materials such as metals or other conductive materials. In one embodiment they can comprise copper deposited using known techniques such as plating and can then be patterned using standard lithographic processes. In other embodiments the layer can be sputtered using a mask to form the desired pattern. In some embodiments according to the present invention some of the conductive features can include only copper, with others of the features including additional materials. For example, the die pads 44 can be plated or coated with additional metals or materials to the make them more suitable for mounting of LEDs. In one embodiment the die pads 44 can be plated with adhesive or bonding materials, or reflective and barrier layers. The LEDs can be mounted to the die pads 44 using known methods and materials such as using conventional solder materials that may or may not contain a flux material or dispensed polymeric materials that may be thermally and electrically conductive.

In the embodiment shown, wire bonds can be included that pass between the conductive traces 46 and each of the LED chips 48 with an electrical signal applied to each of the LED chips 48 through its respective one of the die pads 44 and the wire bonds. In other embodiments, LED chips 48 may comprise coplanar electrical contacts on one side of the LED (bottom side) with the majority of the light emitting surface being located on the LED side opposing the electrical contacts (upper side). Such flip-chip LEDs can be mounted onto the submount 42 by mounting contacts corresponding to one electrode (anode or cathode, respectively) onto the die pad 44. The contacts of the other LED electrode (cathode or anode, respectively) can be mounted to the traces 46.

An optical element/lens 55 is included over the LED chips 48 to provide both environmental and mechanical protection. The lens 55 can be in different locations on the top surface of the submount 42 with the lens typically located at approximately the center of the top surface of the submount 42. In the embodiment shown, the lens is slightly off center of the submount 42 to provide spacing on the submounts top surface for the contact pads that are described in detail below. In some embodiments the lens 55 can be formed in direct contact with the LED chips 48 and the top surface of the submount 42 around the LED chips. In other embodiments there may be an intervening material or layer between the LED chips 48 and the submount's top surface. Direct contact to the LED chips 48 can provide certain advantages such as improved light extraction and ease of fabricating.

As further described below, the lens 55 can be formed over the LED chips 48 using different molding techniques and the lens can be many different shapes depending on the desired shape of the light output. One suitable shape as shown is hemispheric, with some examples of alternative shapes being ellipsoid bullet, flat, hex-shaped and square. Many different materials can be used for the lens such as silicones, plastics, epoxies or glass, with a suitable material being compatible with molding processes. Silicone is suitable for molding and provides suitable optical transmission properties. It can also withstand subsequent reflow processes and does not significantly degrade over time. It is understood that the lens 55 can also be textured to improve light extraction or can contain materials such as phosphors or scattering particles.

For hemispheric embodiments, many different lens sizes can be used, with typical hemispheric lenses being greater than 5 mm in diameter, with one embodiment being greater than approximately 11 mm. The preferred LED array size to lens diameter ratio should be less than approximately 0.6, and preferably less than 0.4. For such hemispheric lenses the focal point of the lens shall be essentially at the same horizontal plane as the emission region of the LED chips.

In yet other embodiments, the lens 55 can have a large diameter of about the same or larger than the distance across or width of the LED array. For circular LED array the diameter of the lens can be approximately the same as or larger than the diameter of the LED array. The focal point for such lenses is preferably below the horizontal plane created by the emitting region of the LED chips. The advantage of such lenses is the ability to spread the light over larger solid emission angles and therefore allow for a broader illuminated area.

The LED package 40 can also comprise a protective layer 56 covering the top surface of the submount 42 in those areas not covered by the lens 55. The layer 56 provides additional protection to the elements on the top surface to reduce damage and contamination during subsequent processing steps and use. Protective layer 56 can be formed during formation of the lens 55 and can comprise the same material as the lens 55. It is understood, however, that the LED package 40 can also be provided without the protective layer 56.

The lens arrangement of the LED package 40 is also easily adapted for use with secondary lens or optics that can be included over the lens by the end user to facilitate beam shaping. These secondary lenses are generally known in the art, with many different ones being commercially available. The lens 55 can also have different features to diffuse or scatter light, such as scattering particles or structures. Particles made from different materials can be used such as titanium dioxide, alumina, silicon carbide, gallium nitride, or glass micro spheres, with the particles dispersed within the lens. Alternatively, or in combination with the scattering particles, air bubbles or an immiscible mixture of polymers having a different index of refraction could be provided within the lens or structured on the lens to provide diffusion. The scattering particles or structures can be dispersed homogeneously throughout the lens 55 or can have different concentrations in different areas of the lens. In one embodiment, the scattering particles can be in layers within the lens, or can have different concentrations in relation to the location of the LED chips 48 emitting different colors of in the array.

Figure 5:
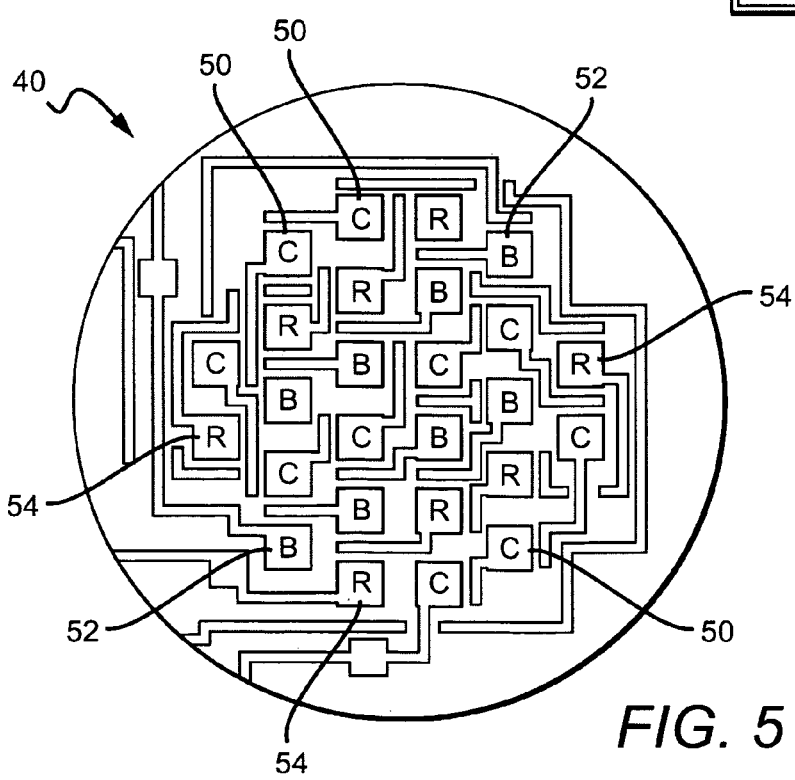
FIG. 5 is a top plan view of one embodiment of an LED chip array layout according to the present invention.

Referring now to FIG. 5, the LED chips 48 can comprise different groups of LEDs chips that emit different colors of light. These different groups should compliment one another by combining so that the LED component produces the desired color of light along with the desired color rendering index (CRI). In one embodiment the LED chips 48 can comprise groups emitting two or more different colors, with a suitable number groups being three. Three different color groups allows for colors to be selected to triangulate into the desired color point, with one such desired color point being on or near the black body locus (BBL) on a CIE Chromaticity Diagram for the desired color temperature. The three different groups can emit different color around the BBL such that when they combine the color emitted by the LED component is on or near the BBL.

In the embodiment shown the LED chips 48 can comprise groups of red emitting LEDs 54 (designated with R), a first group of phosphor coated blue LEDs 52 (designated with B), and a second group of phosphor coated blue LEDs 50 (designated with C). The first and second groups of phosphor coated LEDs 50, 52 can comprise blues LEDs coated with a yellow or green emitting phosphor to provide non-white light sources as described, for example, in U.S. Pat. No. 7,213,940 and below with regard to a specific color hues on the 1931 CIE chromaticity diagram, also known as blue shifted yellow (BSY) LEDs. LED chips having LEDs that emit light having a dominant wavelength in the range of from 430 nm to 480 nm and a phosphor which, when excited, emits light having a dominant wavelength in the range from 555 nm to 585 nm are suitable for use as the BSY solid state light emitters in the first and second groups of BSY LEDs 50, 52. These first and second BSY LED groups 50, 52 can emit different color combinations of blue LED light and phosphor light such that the LED chip groups emit respective colors of light. This allows the emission of the BSY LEDs to combine with the emission of the red LEDs 54 to triangulate to the desired white light emission for the LED component 40. In one embodiment the combined light for the LED chips is on or near the BBL for a desired color point (e.g. correlated color temperature (CCT)) while also providing a high CRI. In particular embodiments, the combined light is perceived as white light (i.e. is within 7 MacAdam ellipses of the BBL).

By dividing the LED chips 48 into three of more groups 50, 52, 54 the LED component 40 can also be arranged to apply respective electrical signals through each of the groups, with each of the signals capable of being adjusted in order to tune the LED component 40 to emit light which more closely approximates the target color coordinates (i.e., even where the individual light emitters, e.g., sold state light emitters, deviate to some degree from their design output light color coordinates and/or lumen intensity). The details for establishing the appropriate current to apply to each of the groups is described in detail U.S. Provisional Patent Application Ser. No. 61/041,404 entitled "Solid State Lighting Devices and Methods of Manufacturing Same," which is incorporated herein by reference.

In one embodiment according to the present invention an LED component 40 is provided that emits white light and in particular, white light near the black body curve and having color temperature of 2700K or 3500K. The LED component includes three groups of LED chips as described above, with first and second groups comprising LEDs which emit BSY light, and another group comprising LEDs which emit red light. The two groups of BSY LEDs 50, 52 are of intentionally different BSY hues, so that the relative intensities of those groups may be adjusted to move along the tie line between the respective color coordinates (on a CIE Diagram) for the two strings. By providing a red group, the intensity of the LED chips in the red group can be adjusted to tune the light output from the lighting device such as to the BBL or to within a desired minimum distance from the BBL (e.g., within 7 MacAdam ellipses).

In one embodiment according to the present invention, the first group of BSY LED chips 50 comprises at least one LED chip where if power is supplied to the first group it emits light having x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38, The second group of BSY LED chips 52 comprises at least one LED chip where if power is supplied to the second group it, emits light having x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

The group of red LED chips 54 comprises at least one LED chip which, if power is supplied to the third string, emits light having a wavelength in the range of 600 nm to 640 nm. Different LED chips can emit different wavelengths of light such as between 610 nm and 635 nm, between 610 nm and 630 nm, between 615 nm and 625 nm.

Referring now to FIG. 4*a*, the groups of LED chips can be interconnected by the traces 46 (and wire bonds depending on the embodiment) in many different arrangements, such as by different serial and parallel interconnect combinations. In the embodiment shown, the traces 46 are on the top surface of the submount 42. This eliminates the need for traces to be placed such that the interconnects are between the LED chips on one or more layers interconnect layer. Additional layers of interconnects may be more costly and more complex to fabricate and reduce the ability to extract heat from the LED chips.

Figure 7:
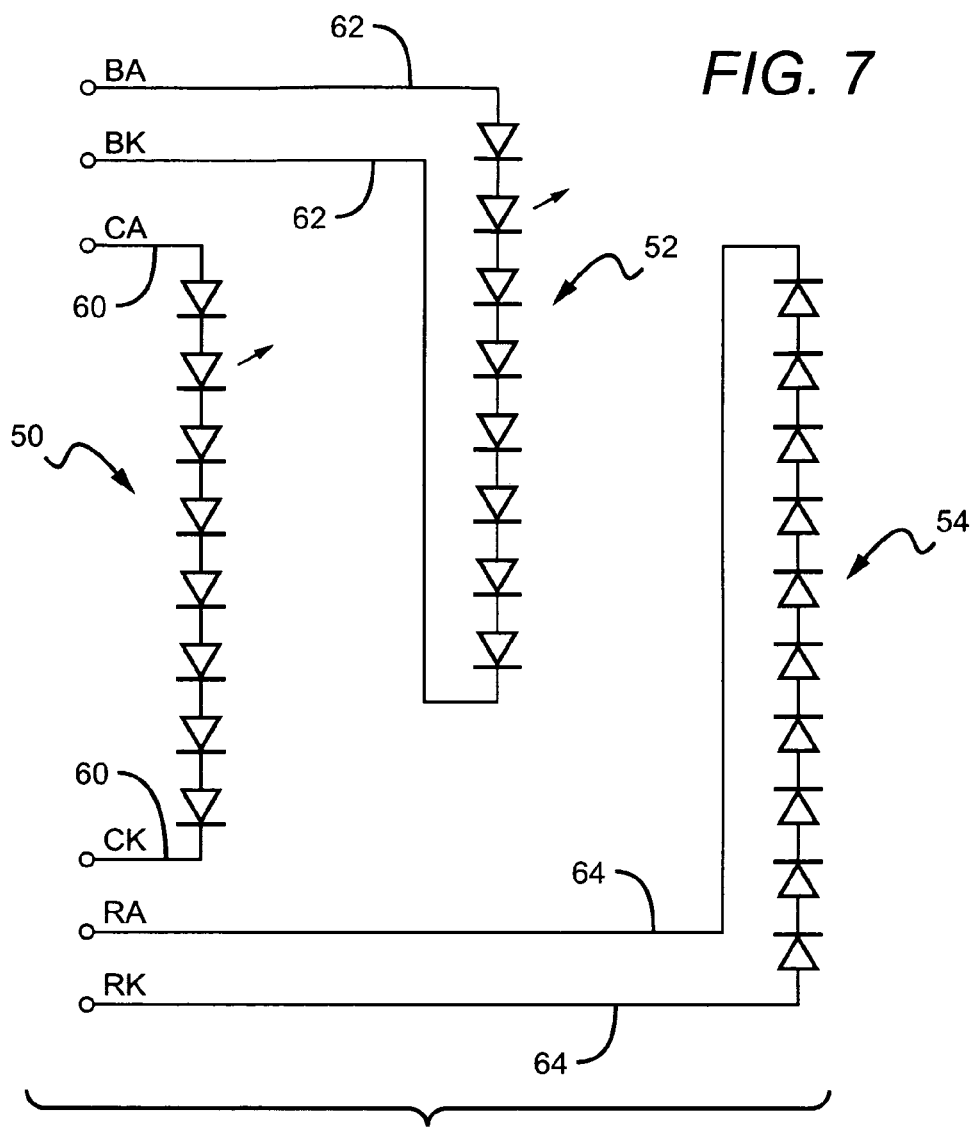
FIG. 7 is schematic showing the one embodiment of interconnects for the LED array according to the present invention.

Referring now to FIGS. 6 and 7 in one embodiment each of the different LED colors groups 50, 52, 54 is interconnected in respective first, second and third serial strings 60, 62, 64 so that an electrical signal applied to the string is conducted to each of the LED chips in the string. By having respective strings 60, 62, 64 for each of the LED colors, different electrical signals can be applied to each of the strings so that different electrical signals can be applied to the different LED color groups 50, 54, 56. This allows for control of the electrical signals so that the colors can emit light at different intensities. Accordingly, the emission of the LED component 40 can be tuned to the desired white light emission by applying different electrical signals to the LED colors color groups 50, 54, 56.

The LED component 40 can have many different contact arrangements for applying electrical signals to the strings 60, 62, 64 such as different ones on the top, bottom and side surfaces of the submount. For those embodiments having contacts pads on the bottom surface, electrically conductive vias can be included through the submount for an electrical signal to pass from the bottom contact pad to the LED chips on the submount's top surface. In other embodiments the electrical signal can run from the bottom-side contact pad to the LED chips along conductive paths on the submount's side surfaces.

The embodiment of the LED component 40 shown comprises contact pads on the top surface with first string contact pads 66*a*, 66*b* for applying an electrical signal to first string 60, second string contact pads 68*a*, 68*b* for applying an electrical signal to the second string 62, and third string contact pads 70*a*, 70*b* for applying an electrical signal to the third string 64. The contact pads 66*a*-*b*, 68*a*-*b* and 70*a*-*b* are along one of the edges of the submount 42, although it is understood that they can be in many different locations on the top surface. By arranging the contact pads in this way, the LED component 48 can be contacted along one edge and from one side of the component 40. By having the contacts on the top surface of the submount it is not necessary to provide contacting features on the submount's bottom surface that can interfere with thermal dissipation, and it is not necessary to have multiple interconnect layers. The submount 48 can be directly mounted to a heat dissipating device, such as heat sink, without intervening devices such a printed circuit boards (PCBs). This allows for improved thermal management for the LED component 48.

As best shown in FIG. 4*a*, each of the strings 60, 62, 64 also comprises an electrostatic discharge (ESD) pad 80*a*, 80*b*, 80*c* each of which is arranged to allow an ESD protection chip (not shown) to be mounted along a respective one of the strings 60, 62, 64. Each of the pads 80*a*, 80*b*, 80*c* is arranged adjacent to a trace from a different one of its string and the ESD chip can be mounted to its one of the pads 80a, 80b, 80c with a wire bond to the adjacent trace of its string. For example, the ESD chip mounted to pad 80a can have a wire bond connection to adjacent trace on its string 64. When an ESD event occurs for instance on string 64 a spike in an electrical signal can be conducted on trace 46. The spike in voltage is fed through the ESD chip on pad 80c, through the wire bond to its string and out contact. The spike can then conduct off the LED component 40 without damaging the LED chips 48. The ESD chips on each of the other strings operate in much the same way to protect the LED chips 48 from an ESD event.

Different elements for the ESD protection chips, such as various vertical silicon (Si) Zener diodes, different LEDs arranged in parallel and reverse biased to the LED chips 48, surface mount varistors and lateral Si diodes. In one embodiment a Zener diodes are utilized and is mounted to the ESD chip pads 80a, 80b, 80c using known mounting techniques. These diodes are relatively small so that the does not cover an excessive area on the surface of the submount 42.

Each of the LED strings 60, 62, 64 can require a driving signal of more than 20 volts, so the ESD protection chips can only be activated at voltages substantially in excess of the driving signal. In some embodiments the ESD chip can be activated with signals in excess of 30 volts, while in other embodiments the ESD chips can be activated with signals in excess of 35 volts.

In some embodiments, the LEDs chips 48 should be as tightly packed on the submount 42 to minimize the "dead space" between LED chips 48. There are certain factors that can limit how tightly the LEDs can be packed such as the size of the die pads 44 and the traces 46, as well the ability of the LED component 40 to draw heat away from the LED chips 48. By tightly packing the LED chips 48, the LED component can experience increased natural mixing of the LED light, which can in turn reduce the need for diffusers or other light mixing devices that typically reduce overall emission efficiency of the LED component 40. Tightly packing can also provide smaller sized components that can have a form factor compatible with existing lamps, and can also provide the ability to shape the output beam into a particular angular distribution.

Embodiments according to the present invention can comprise different number of LED chips 48, with the LED component 40 comprising twenty-six (26) LEDs. The LED chips 48 can comprise differing sized groups of LEDs emitting at different colors, with the LED component 40 comprising eight (8) of the first BSY LED group 50, eight (8) of the second BSY LED group 52, and (10) red emitting LEDs 54. The LEDs 48 can be arranged on the submount in many different ways with the preferred LED component 40 having LED chips 48 arranged pursuant to certain guidelines.

First, the LED chips 48 should be positioned on the submount 42 so that the red LEDs 54 are not directly next to another one of the red LEDs 54. For purposes of describing the relationship between the red LEDs, "not directly next to" means that there are no parallel surfaces LEDs of the red LEDs 54 facing each other with no other intervening LED. In some embodiments, there may be a small portion of the red LEDs parallel surfaces facing each other, but this should be less than 50% overlap of the parallel surfaces. In the preferred embodiment, the red LEDs 54 should be diagonal to one another so that the so that the closest point between adjacent LEDs are the corners of the red LEDs 54. The red LEDs 54 should have first or second BSY LEDs 50, 52 adjacent to it, which promotes color mixing and reduces the appearance of red in the near and far field.

As a second guideline, the LED chips 48 should also be arranged so that as few as possible of the red LED chips 54 are on the perimeter of the LED chip array. In some embodiments, such as the one shown in FIG. 5 some red LED chips 54 can be on the perimeter, but in a preferred embodiment less than 50% of the red LEDs 54 are on the perimeter. The LED component 40 is typically utilized in conjunction with a mirror that is adjacent to the LED chips array, and reflects light from the LED chips. Red LED chips 54 at the perimeter may be more prominently imaged by the reflector, and for each of the red LED chips 54 on the perimeter the reflector gives the appearance of two red LED chips. This increases the likelihood of seeing red color spots in the array, both in the near and far field. Perimeter red LED chips 54 are also outside the optical center of the LED array, which reduces the natural mixing of red LED light with the others colors of LED light in the array.

As a third guideline, the LED chips 48 should also be arranged so that each of the red LED chips 54 has at least three LED chips from the first and second BSY LED chips 50, 52 adjacent to it. In the preferred embodiment each red LED chip 54 has more than three adjacent to it. The first and second BSY chips 50, 52 need not be directly next to or adjacent the red LED, but can be diagonal or at angles to the red LED. This arrangement promotes mixing or balancing of the emission energy at the LED level, which in turn helps promote color mixing of the light from the different LEDs.

It is understood that different embodiments of components according to the present invention can follow all three or different ones of the three guidelines to achieve the desired color mixing. For example, because of the number of LED chips in each of the LED chip groups it may not be possible to surround each of the red LED chips with three BSY chips. Yet by utilizing the other guidelines the desired color and color mixing can be achieved. The same can be true for embodiments that do not follow the other two of the guidelines.

Additionally, in some embodiments of the present invention, the light from the LED chips is mixed so as to provide color spatial uniformity where the variation of chromaticity in different directions (i.e., with a change in viewing angle) is within 0.004 from the weighted average point on the CIE 1976 (u',v') diagram in the near field and/or the far-field. In particular embodiments, the color spatial uniformity across the output beam of the device is less than 7 MacAdam ellipses, less than 5 MacAdam ellipses or less than 2 MacAdam ellipses on the 1931 CIE chromaticity diagram.

As mentioned above, in some embodiments heat does not spread efficiently into the submount, particularly those made of materials such as ceramic. When LED chips are provided on die pads that are generally around the middle of the submount's top surface, heat can concentrate around the area just below the LEDs and does not spread throughout the submount where it can dissipate. This can cause overheating of the LED chips which can limit the operating power level for the LED package.

To help dissipate heat, the LED package 40 can comprise a bottom metal layer 92 on the bottom surface of the submount 42. In different embodiments the metal layer 92 can cover different portions of the submount's bottom surface and in the embodiment shown it covers substantially all of the bottom surface. The metal layer 92 is preferably made of a heat conductive material and is preferably in at least partial vertical alignment with the LED chips 48. In one embodiment, the metalized area is not in electrical contact with the elements on top surface of the submount 42. Heat that can concentrate below the LED 48 chips will pass into the submount 42 directly below and around the LED 48. The metal layer can assist with heat dissipation by allowing this heat to spread from the concentrated area into the larger area provided by the metal layer where it can dissipate more readily. The metal layer 92 can also have holes 94 passing through it to the submount 42, with the holes relieving strain between the submount 42 and the metal layer 92 during fabrication and during operation. In other embodiments thermally conductive vias or plugs can also be included that pass at least partially through submount 42 and are in thermal contact with the metal layer 92. Heat that passes into the submount 42 can more readily pass to the metal layer 92 through the conductive vias 74 to further enhance thermal management. Other embodiments according to the present invention can comprise different features to enhance thermal dissipation.

It is understood that different embodiments of the present invention can also include features to further mix the colors from the LED chips 48. A diffuser can be included on the in conjunction with the LED component 40. Diffusers of this type are described in U.S. Provisional Patent Application No. 60/130,411, entitled "Light Source With Near Field Mixing," which is incorporated herein by reference.

Figure 8:
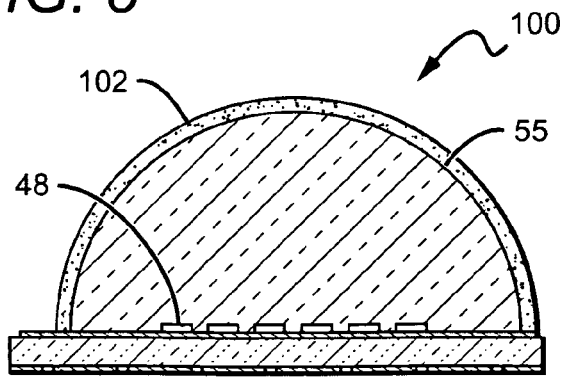
FIG. 8 is a side view of one embodiment of an LED component according to the present invention having a diffuser.

Referring now to FIG. 8 shows another embodiment of an LED component 100 similar to LED component 40, and comprising a lens 55 and on the top surface of the lens 55 a diffuser can be included in the form of a diffuser film/layer 100 that is arranged to mix the light emission from the LED chips in the near field. That is, the diffuser mixes the emission of the LED chips 48 such that when the LED component 40 is viewed directly, the light from the discrete LED chips 48 is not separately identifiable. Instead, when the LED component 40 is viewed directly it approximates a single light source under the lens 55.

The diffuser film 100 can comprise many different structures and materials arranged in different ways, and can comprise a conformally coat over the lens 55. In different embodiments, commercially available diffuser films can be used such as those provided by Bright View Technologies, Inc. of Morrisville, N.C., Fusion Optix, Inc. of Cambridge, Mass., or Luminit, Inc. of Torrance, Calif. Some of these films can comprise diffusing microstructures that can comprise random or ordered micro lenses or geometric features and can have various shapes and sizes. The film 100 can be sized to fit over all or less than all of the lens 55 and can be bonded in place over the lens 55 using known bonding materials and methods. For example, the film 100 can be mounted to the lens with an adhesive or could be film insert molded with the lens 55. In other embodiments, the diffuser film can comprise scattering particles, or can comprise index photonic features, alone or in combination with microstructures. The diffuser film can have many different thicknesses with some diffuser films available in a thickness ranging from 0.005 inches to 0.125 inches, although films with other thicknesses can also be used.

By providing a diffuser film on the lens 55, light from the LED chips 48 can be mixed in the near field such that the light output of the LED component 40 is perceived as a combination of the light from the LED chips 48. In one embodiment, the combined light is a white light combination of light from the LED chips 48. Furthermore, the light in the far field is also perceived as a combination of light from the LED chips 48, such as white light. Thus a low profile white light source can be provided from an array of different colored sources that appear as white when viewed directly.

In other embodiments, the diffuser/scattering pattern can be directly patterned onto the lens. Such a pattern may, for example, be random or pseudo pattern of surface elements that scatter or disperse light passing through them. The diffuser can also comprise microstructures within the lens 55, or a diffuser film can be included within the lens 55.

FIG. 8 shows another embodiment of an LED component 120 according to the present invention, comprises LED chips 48 mounted on a submount 42, and a diffuser layer/film 122 In this embodiment, the diffuser comprises as diffuser layer/film 122 that can be made of the same materials as the diffuser film 100 described above. In this embodiment, however, the diffuser film 122 is remote from the lens, but not so remote as to provide substantial mixing from the reflection of light external to the lens. The diffuser film 122 can be different distances from the lens 55 such as 1 millimeter (mm). In other embodiments the film 122 can be many different distances from the lens 55, such as, 5 mm, 10 mm or 20 mm, but other distances can also be used. Furthermore, the diffuser film can have different shapes. The shape may depend on the configuration of the lens 55. For example, a curved diffuser film that was spaced from but conformed to the shape of the lens could be provided as a dome over the lens. In one embodiment, the dome can be held in place by the perimeter of the device. In other embodiments, the diffuser can be supported on posts or other structures.

It is understood that diffuser arrangements according to the present invention can be used with many different sized LED components with different numbers of LEDs in their LED array. The diffuser can likewise have many different sizes. By way of example, one embodiment of an LED component according to the present invention can have a 12 mm by 15 mm submount, and can have 26 LEDs in its LED array. The array can be covered by a lens with cone shaped diffuser mounted to the lens. The diffuser can have a height of approximately 8 mm and a base of approximately 17 mm.

Embodiments according to the present invention may be utilized with light sources having the characteristics described in U.S. Pat. No. 7,213,940 and/or in U.S. Patent Application Publication Nos. 2007/0139920; 2007/0267983; 2007/0278503; 2007/0278934; 2007/0279903; 2008/0084685 and/or 2008/0106895, the disclosures of which are incorporated by reference herein, with the emission of the light sources mixed in the near field. Furthermore, the light sources may be provided as three or more strings of LEDs as described in U.S. Provisional Application Ser. No. 61/037, 365—see e.g. FIG. 35 and the discussion relating thereto).

LED components according to the present inventive subject matter may be used with or without further optics. For example light sources according to the present invention may be used without an additional optic to provide a low profile under cabinet light. Light sources according to the present inventive subject matter could also include additional beam shaping, said provided in commercially available MR16 LED lamps. Also, reflective optics, including back reflective optics or forward reflecting optics could also be utilized. For example, the LED component or light source according to some embodiments of the present invention could be utilized with the optics described in any of the following U.S. Pat. Nos. 5,924,785; 6,149,283; 5,578,998; 6,672,741; 6,722,777; 6,767,112; 7,001,047; 7,131,760; 7,178,937; 7,230,280; 7,246,921; 7,270,448; 6,637,921; 6,811,277; 6,846,101; 5,951,415; 7,097,334; 7,121,691; 6,893,140; 6,899,443 and 7,029,150, and in U.S. Patent Application Publication Nos. 2002/0136025; 2003/0063475; 2004/0155565; 2006/0262524; 2007/0189017 and 2008/0074885.

It is understood that the LED chips in the arrays can be arranged as one or more multiple multi-chip LED lamps as described in U.S. Patent Publication No. 2007/0223219 entitled "Multi-Chip Light Emitting Device for Providing High-CRI Warm White Light and Light Fixtures Including the Same", the disclosure of which is incorporated by reference as if set forth in its entirety.

Although the present invention has been described in detail with reference to certain preferred configurations thereof, other versions are possible. Therefore, the spirit and scope of the invention should not be limited to the versions described above.

We claim:

1. A light emitting diode (LED) component, comprising:
an array of LEDs comprising groups of first, second, and third LEDs, wherein no two of the first group LEDs are directly next to one another in said array;
wherein less than fifty percent (50%) of the LEDs in said first group of LEDs are on the perimeter of said array; and
a lens over at least a portion of said array, said lens at least partially surrounding said array on at least two sides;
wherein each of said first, second, and third groups of LEDs are connected in respective serial strings.

2. The LED component of claim 1, wherein said first group of LEDs comprises red emitting LEDs.

3. The LED component of claim 1, wherein said second group of LEDs comprises blue shifted yellow (BSY) LEDs.

4. The LED component of claim 1, wherein said LEDs are mounted on a submount.

5. The LED component of claim 4, further comprising die attach pads, conductive traces and contact pads on the top surface of said submount.

6. The LED component of claim 5, wherein said conductive traces connect said first and second groups of LEDs in respective serial strings.

7. The LED component of claim 5, wherein said contact pads are at the edge of said submount and along one side of said submount.

8. The LED component of claim 1, further comprising two electrostatic discharge (ESD) protection devices, each of which is mounted to a respective one of said strings to protect said LEDs on said strings from ESD damage.

9. The LED component of claim 1, wherein said second and third groups of LEDs comprise blue-shifted yellow (BSY) LEDs of different BSY hues.

10. The LED component of claim 1, where said first group of LEDs comprises at least one LED emitting light having a wavelength in the range of 600 nm to 640 nm.

11. The LED component of claim 1, wherein said second group of LEDs comprises at least one LED emitting light having x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

12. The LED component of claim 1, wherein third group of LEDs comprises at least one LED emitting light having x, y color coordinates which define a point which is within an area on a 1931 CIE Chromaticity Diagram enclosed by first, second, third, fourth and fifth line segments, the first line segment connecting a first point to a second point, the second line segment connecting the second point to a third point, the third line segment connecting the third point to a fourth point, the fourth line segment connecting the fourth point to a fifth point, and the fifth line segment connecting the fifth point to the first point, the first point having x, y coordinates of 0.32, 0.40, the second point having x, y coordinates of 0.36, 0.48, the third point having x, y coordinates of 0.43, 0.45, the fourth point having x, y coordinates of 0.42, 0.42, and the fifth point having x, y coordinates of 0.36, 0.38.

13. The LED component of claim 1, wherein said lens comprises a molded lens.

14. The LED component of claim 1, wherein said lens is molded prior to being placed over said at least a portion of said array.

15. The LED component of claim 1, wherein no two of the first group LEDs have surfaces overlapping at 50% or greater.

16. The LED component of claim 1, wherein no two of the first group of LEDs have surfaces facing each other.

17. The LED component of claim 1, wherein a closest point between two of the first group of LEDs are between corners of said two of the first group of LEDs.

18. A light emitting diode (LED) component, comprising:
an array of LEDs on a submount, said array of LEDs comprising a first group of LEDs and one or more additional groups of LEDs, wherein at least three LEDs from said one or more additional groups are adjacent to each of said LEDs in said first group, wherein said first group of LEDs and each of said one or more additional groups of LEDs are connected in respective serial strings,
wherein less than fifty percent (50%) of the LEDs in said first group of LEDs are on the perimeter of said array;
a lens over at least a portion of the array;
wherein said one or more additional groups of LEDs comprise blue shifted yellow (BSY) or blue shifted green (BSG) LEDs.

19. The LED component of claim 18, wherein said first group of LEDs comprise red emitting LEDs.

20. The LED component of claim 18, wherein said one or more additional groups of LEDs comprises first and second groups of (BSY) BSY LEDs.

21. The LED component of claim 18, wherein said LEDs are mounted on a submount.

22. The LED component of claim 18, further comprising a protective layer at least partially covering a surface of said submount.

23. The LED component of claim 22, wherein different electrical signals can be applied to each of said series strings.

24. The LED component of claim 18, further comprising a plurality of ESD protection devices, each of which is mounted to a respective one of said strings to protect said LEDs on said strings from ESD damage.

25. The LED component of claim 18, wherein said lens is molded prior to being placed over said at least a portion of said array.

26. The LED component of claim 18, wherein no two LEDs of the first group of LEDs that are directly next to each other have parallel side surfaces facing each other that overlap in a planar direction by 50% or greater.

27. The LED component of claim 18, wherein no two of the first group of LEDs have surfaces facing each other.

28. The LED component of claim 18, wherein a closest point between two of the first group of LEDs are between corners of said two of the first group of LEDs.

29. The LED component of claim 18, wherein said lens and said protective layer are comprised of the same material.

30. A light emitting diode (LED) component, comprising:
an array of LEDs mounted on a submount, said array of LEDs comprising a first group of LEDs and one or more additional groups of LEDs, wherein less than fifty percent (50%) of the LEDs in said first group of LEDs is on the perimeter of said array;

wherein each of said first group of LEDs and one or more additional groups of LED are connected in respective serial strings.

31. The LED component of claim 30, further comprising a submount and a lens, wherein said LEDs are mounted to said submount and said lens is over at least a portion of the said LEDs.

32. The LED component of claim 31, wherein said lens and said protective layer are comprised of the same material.

33. The LED component of claim 30, wherein said first group of LEDs comprise red emitting LEDs.

34. The LED component of claim 30, wherein said one or more additional groups of LEDs comprises first and second groups of blue shifted yellow (BSY) LEDs.

35. The LED component of claim 30, further comprising a protective layer at least partially covering a surface of said submount.

36. The LED component of claim 30, wherein no two LEDs of the first group of LEDs that are directly next to each other have parallel side surfaces facing each other that overlap in a planar direction by 50% or greater.

37. The LED component of claim 30, wherein no two of the first group of LEDs have surfaces facing each other.

38. The LED component of claim 30, wherein a closest point between two of the first group of LEDs are between corners of said two of the first group of LEDs.

39. A light emitting diode (LED) component, comprising:
an array of LEDs comprising a first group of LEDs and one or more additional groups of LEDs, wherein at least three LEDs from said one or more additional groups are adjacent to each of said LEDs in said first group, wherein no two LEDs of the first group of LEDs that are directly next to each other have parallel side surfaces facing each other that overlap in a planar direction by 50% or greater; and a lens over at least a portion of said array wherein said first group of LEDs and each of said one or more additional groups of LEDs are connected in respective serial strings;

wherein said one or more additional groups of LEDs comprise blue shifted yellow (BSY) or blue shifted green (BSG) LEDs.

40. The LED component of claim 39, wherein said LEDs are mounted to a submount.

41. The LED component of claim 39, wherein no two of the first group of LEDs have surfaces facing each other.

42. The LED component of claim 39, wherein a closest point between two of the first group of LEDs are between corners of said two of the first group of LEDs.

43. A light emitting diode (LED) component, comprising:
an array of LEDs comprising a first group of LEDs and one or more additional groups of LEDs wherein:
no two LEDs from said first group are directly next to one another in said array;
less than fifty percent (50%) of the LEDs in said first group of LEDs is on the perimeter of said array; and
at least three LEDs from said one or more additional groups is adjacent each of said LEDs in said first group; and a lens over at least a portion of the said array;

wherein each of said first group of LED and one or more additional groups of LED are connected in respective serial strings.

44. The LED component of claim 43 wherein said LEDs are mounted to a submount.

45. The LED component of claim 43, wherein no two LEDs of the first group of LEDs that are directly next to each other have parallel side surfaces facing each other that overlap in a planar direction by 50% or greater.

46. The LED component of claim 43, wherein no two of the first group of LEDs have surfaces facing each other.

47. The LED component of claim 43, wherein a closest point between two of the first group of LEDs are between corners of said two of the first group of LEDs.

* * * * *